United States Patent [19]

Davis et al.

[11] Patent Number: 5,585,288
[45] Date of Patent: Dec. 17, 1996

[54] DIGITAL MMIC/ANALOG MMIC STRUCTURES AND PROCESS

[75] Inventors: Susan E. Davis, Chelmsford; Paul F. Newman, Cambridge; Kamal Tabatabaie-Alavi, Hyde Park, all of Mass.

[73] Assignee: Raytheon Company, Lexington, Mass.

[21] Appl. No.: 554,215

[22] Filed: Jul. 16, 1990

[51] Int. Cl.$^6$ .................................................. H01L 21/265
[52] U.S. Cl. .................. 437/38; 437/39; 437/46; 437/49
[58] Field of Search ................. 437/38, 39, 46, 437/49

[56] References Cited

U.S. PATENT DOCUMENTS

| | | | |
|---|---|---|---|
| 4,433,471 | 2/1984 | Ko et al. ........................ | 437/38 X |
| 4,557,036 | 12/1985 | Kyuragi et al. ................. | 437/46 X |
| 4,849,368 | 7/1989 | Yamashita et al. .............. | 437/49 X |
| 4,910,157 | 3/1990 | Hasegawa et al. .............. | 437/39 X |
| 4,914,050 | 4/1990 | Shibata ........................... | 437/38 |

*Primary Examiner*—Peter A. Nelson
*Attorney, Agent, or Firm*—Donald F. Mofford

[57] ABSTRACT

A transmit/receive module including digitally controlled analog circuits is described. The digital circuits use a logic family adapted for use with analog monolithic integrated circuits. The disclosure also describes a preferred process to provide digital and analog microwave circuits on a common semiconductor substrate.

4 Claims, 19 Drawing Sheets

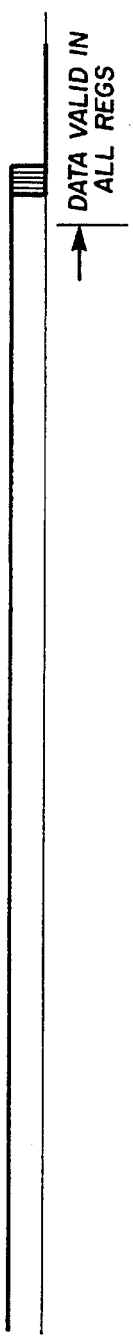
FIG. 8A SHIFT/CLK
FIG. 8B ATT REG
FIG. 8C φ SHIFT REG
FIG. 8D HP AMP REG
FIG. 8E LN AMP REG
FIG. 8F LT HN — DATA VALID IN ALL REGS

DIGITAL MMIC/ANALOG MMIC STRUCTURES AND PROCESS

This invention was made with Government support under Contract F30602-87-C-0217 awarded by Rome Laboratory, Griffiss Air Force Base, New York. The Government has certain rights in this invention.

BACKGROUND OF THE INVENTION

This invention relates generally to radio frequency circuits, and more particularly to fabrication of microwave analog circuits and digital control circuits on a common substrate.

As it is know in the art, monolithic microwave integrated circuits are used in a variety of applications. Such circuits, including amplifiers, switches, phase shifters, attenuators, and the like often require control signals to be fed to the circuits to switch amplifiers on and off, change the state of a switch, vary a phase shift imparted to a signal propagating through a phase shifter, or vary the amplitude of a signal fed through an attenuator, for example. One particular application for these analog circuits is arranged to provide an active transmit/receive (T/R) module for use in a phased array antenna system.

A phased array antenna includes a plurality of such T/R modules arranged in an array and each having the capability to impart to a signal a selected differential phase and/or amplitude characteristic. In a transmit mode, such modules are fed a common signal through a common feed network to provide a plurality of signal portions, each of which is acted upon by a corresponding T/R module to produce a plurality of transmit signals which are used to form directed and generally collimated beams of electromagnetic energy. The modules are also used to electronically steer such beams by varying the phase characteristics of the signals. There are many particular arrangements for T/R modules. A common configuration of a T/R module includes a reciprocal phase shifter and an optional attenuator disposed in a common path. A pair of switches and a pair of amplifiers, one amplifier being a high-power transmit amplifier, whereas the other amplifier being a low-noise receive amplifier are used to provide a pair of switchable amplication signal paths. A transmit signal is typically fed through the phase shifter to one of the switching circuits. The switching circuits are controlled to steer such phase shifted transmit signal through the transmit amplifier, through the other switch and onto a radiating element, during a transmit mode. In a receive mode, the switching circuits steer a received signal from the radiating element to the receive amplifier and through the phase shifter.

A common type of phase shifter employed in such a T/R module is a digitally controlled phase shifter, which can provide, in response to a control word, incremental differential phase shift to a signal propagating therethrough. A common configuration of a digitally controlled phase shifter includes a plurality of switchable phase shift elements which are controlled by feeding a parallel digital word to the gates of a corresponding plurality of transistors to switch such phase shift elements (typically lumped element network or lines of transmission line) into or out of the path of the propagating signal. Similarly, digital attenuators switches and amplifiers commonly used in T/R circuits are directly or indirectly controlled by digital control signals.

The general approach to control such analog circuits is to use separate digital circuits mounted in a T/R module package to interface the analog circuit with a beam steering controller, for example. Digital outputs from the digital circuits are connected to the analog circuit via wire bonds.

It is inefficient to use separate digital and analog microwave integrated circuits to control the transmit/receive module. Separate circuits only increase the size of the package and also increase the number of interconnections required between the digital circuits and the monolithic microwave integrated circuits to accommodate each parallel digital control word which is required to each of the circuits. It would be desirable therefore, to integrate both digital and analog functions on a common integrated circuit substrate. The benefits of such an arrangement would be several including reducing package size and reducing the cost associated with numerous bonding operations.

There are several problems, however, with having digital and analog circuits on a common substrate. In general, monolithic microwave integrated circuits particularly those fabricated with GaAs have relatively low yields due to various factors. For example, such circuits are required to operate at very high frequencies over microwave regions where minor variations in component values or in parasitics can introduce unwanted operational effects in the integrated circuits. Moreover, with Group III–V materials, such as gallium arsenide, processing technologies are not as well developed at this juncture as are other material technologies, such as silicon.

The principal operating characteristics of monolithic analog microwave integrated circuits include power generation capabilities and/or low-noise operation. On the other hand, digital monolithic integrated circuits are generally fabricated for dense packaging and very high speed operation. A standard logic family for digital monolithic integrated circuits formed by metal electrode semiconductor field effect transistors on gallium arsenide substrates is a logic family known as Buffered FET Logic (BFL). A typical high-performance depletion mode MESFET used in a BFL logic circuit is generally fabricated with one micron long gates and with doping levels about $(3\times10^{17})^3$ centimeters. With this particular technology, circuits made or provided with minimum geometric FETs and with typical fan outs and line lengths will dissipate about 5 milliwatts per gate and have gate delays around 100 picoseconds (ps). The yield on these devices, particularly with the high-performance requirements are also generally relatively low compared to yields with silicon based digital devices.

Therefore, to combine the digital monolithic integrated circuits with analog monolithic microwave integrated circuits, would necessitate the use of the high-performance logic family mentioned above. This would add little to improve the performance of the control functions for the analog monolithic microwave integrated circuits, but would most likely reduce overall monolithic microwave integrated circuit device yield. Moreover, the BFL logic family consumes a lot of power due in part to high speed operation. It would be desirable to maintain the digital monolithic integrated circuit portions at lower temperatures to permit higher power dissipation by the analog portion of such circuits. Moreover, lower power dissipation and minimum spacing of the digital circuits would increase the yields of such circuit and the yield of analog monolithic microwave integrated circuits incorporating such digital circuits.

However, there are basic differences between the requirements for analog monolithic microwave integrated circuits and digital monolithic integrated circuits. Amongst these differences are that analog MESFETs are fabricated to be low-noise and/or high-power devices. Whereas for digital transistors, the noise performance as well as power capabilities of such digital transistors are of minor importance. With digital MESFETs threshold voltage is a significant factor, since it determines switching states for the devices and thus the logic noise immunity or noise margin for the logic family. For analog MESFETs, threshold voltage is not a significant concern and can vary somewhat from device to device. In MESFET transistors, threshold voltage is controlled by etching the source-drain channel region prior to depositing of the gate electrode. In a digital MESFET, a shallow etch is provided to more easily control the threshold voltage of the digital FET, whereas in an analog MESFET, a deep etch is used. Accordingly, these requirements are incompatible. Moreover, those analog monolithic microwave integrated circuits, operating at high power dissipation require thick metal interconnects to prevent electromigration. Thick interconnects are also useful to lower resistivity of the interconnects for low or high power circuits. The lower resistivity interconnect improves noise performance and efficiency of the analog MMICs. With the interconnection for digital circuits, it is preferrable to provide thin interconnects to conserve chip space thus permitting the devices to be densely packed. Accordingly, these as well as other incapabilities between the processing of analog and digital circuits have heretofore discouraged combination of such devices on a single substrate.

SUMMARY OF THE INVENTION

In accordance with the present invention, a method of fabricating digital monolithic integrated circuits and analog monolithic microwave integrated circuits on a common substrate includes the steps of providing a substrate having regions for digital metal semiconductor field effect transistors, level shifting diodes, and analog metal semiconductor field effect transistors, said digital transistor region and analog transistor regions each including a channel region disposed in said substrate having source and drain contacts disposed in ohmic contact with said channel regions, the diode region includes a channel region having an ohmic contact. A patterned layer of metal is provided over said substrate to form bottom layer interconnects for the digital transistors, thick source and drain contacts for the analog transistors, and a Schottky barrier contact for the level shifting diode. With this particular arrangement, the same metal definition step used to thicken ohmic contacts on the analog transistors, and provide first level interconnects for the digital transistor is used to form Schottky contact to the channel region of the level shifting diode.

In accordance with a further aspect of the present invention, a method of providing a digital monolithic integrated circuit and an analog monolithic microwave integrated circuit on a common substrate includes the steps of providing a substrate having regions for digital metal semiconductor field effect transistors and analog semiconductor field effect transistors. Channel regions for digital and analog MESFETS are provided by implanting ions to provide a first channel in each one of said digital MESFET regions; and implanting ions to provide a second channel through each one of said analog MESFET regions, with said second channel region being deeper relative to the depth of the first channel region of the digital MESFETs. Source and drain electrodes are formed over source and drain regions of said digital and analog MESFETs. The method further includes the step of simultaneously etching first and second recesses in the respective first and second channel region of the digital and analog MESFETs respectively to provide recessed portions in the said channels to simultaneously define different voltage threshold levels for digital transistors and the analog transistors. A gate electrode is provided in Schottky barrier contact with said channel regions in each one of the analog and digital MESFETs. With this particular arrangement, by providing separately shallow and deep implants and a simultaneous etch to form the channel layers, the incompatible voltage threshold requirements for digital MESFETs and analog MESFETs are satisfied by a relatively few number of processing steps.

In accordance with a still further aspect of the present invention, the digital monolithic integrated circuit and analog monolithic microwave integrated circuit formed on a common substrate includes a substrate having regions for digital metal semiconductor field effect transistors and analog metal semiconductor field effect transistors. Said digital transistor region and analog transistor regions each including a channel region disposed in said substrate having source and drain contacts disposed in ohmic contact with said channel regions. The channel regions of each analog transistor and each digital transistor has a gate electrode in Schottky barrier contact with the material of such respective channel regions. The analog transistors have a first threshold voltage to pinch off the channel typically about −4 V, whereas the digital transistors have a second threshold voltage characteristic to pinch off the channel of typically around −1 V. With this particular arrangement by forming analog and digital MESFETs on a common substrate, an integrated circuit which uses digital logic circuits to contact analog circuits such as microwave amplifiers, switches and the like is provided.

BRIEF DESCRIPTION OF THE DRAWINGS

The foregoing features of this invention, as well as the invention itself, may be more fully understood from the following detailed description of the drawings, in which:

FIGS. 8A, 8B, 8C, 8D and 8F are timing diagrams useful for understanding the control operation of the T/R module shown in FIG. 8;

DESCRIPTION OF THE PREFERRED EMBODIMENTS

Figure 1:
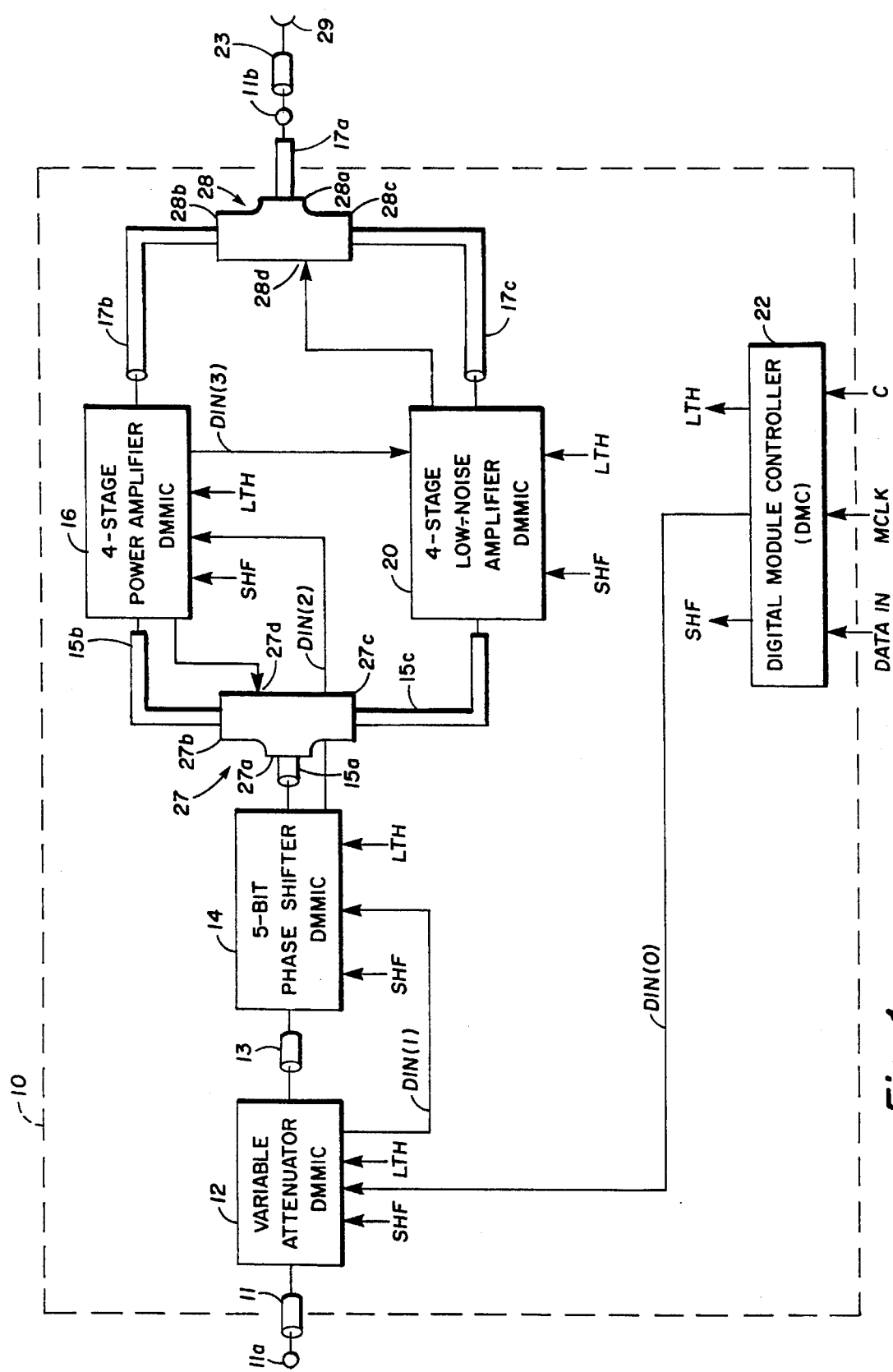
FIG. 1 is a block diagram of a transmit/receive module having digitally controlled analog circuits in accordance with the present invention.

Referring now to FIG. 1, a transmit/receive module 10 is shown to include an optional, reciprocal variable attenuator 12 having a first input/output port coupled, via a transmission line 11, to a first input/output terminal 11a of T/R module 10 and a second input/output coupled, via a transmission line 13, to a first input/output port of a 5-bit reciprocal variable phase shifter 14. Variable phase shifter 14 has a second input/output port coupled, via a transmission line 15a to a common port 27a of a T/R switch 27. Switch 27 has branch ports 27b, 27c connected via lines 15b, 15c to an input of 4-stage, high-power transmit amplifier 16 and an output of 4-stage low-noise receiver amplifier 20, respectively. T/R switch 27 couples a signal between common port 27a and one of the pair of branch ports 27b, 27c in accordance with a digital control signal fed to control terminal 27d. The T/R module 10 further includes a second T/R switch 28 having a common port 28a coupled to output 11b and radiator element 29 via lines 17a, 23. The switch 28 also has branch ports 28b, 28c coupled to amplifiers 16, 20 respectively, as shown.

During a transmit mode, a signal is fed to terminal 11a from an electronic system (not shown). Such signal is provided with a selected phase and amplitude characteristic imparted thereto by attenuator 12 and phase shifter 14. A control signal is fed to T/R switch 27 to couple the signal from the phase shifter 14 between ports 27a and 27b of the T/R switch 27 in response to a control signal fed to terminal 27d. The signal from port 27b is fed to the transmit amplifier 16, amplified, and fed to port 28b of T/R switch 28 via line 17b. The T/R switch 28 in response to a control signal fed to control terminal 28d couples the common port 28a to branch port 28b, permitting the propagating signal to be fed to the second input/output terminal 11b of the T/R module 10 and radiating element 29 via transmission lines 17a and 23. The branch port 28c of T/R switch 28 is connected via transmission line 17c to the 4-stage low-noise receiver amplifier 20, here said amplifier 20 being used to receive a signal fed from radiating element 29. The output of said low-noise amplifier 20 is fed to transmission line 15c to T/R switch 27 and thus onto phase shifter 14 and variable attenuator 13 during a receive mode of the circuit 10.

The transceiver module 10 further includes a digital module controller 22, which provides a gated shift signal SHF and a latch command signal LTH. Signals SHF and LTH are fed to each of said circuits 12, 14, 16, 20 to control said circuits, and here T/R switches 27 and 28 in a manner as will be described. Digital module controller 22 further includes a serial output data line $DIN_0$, which is here fed to an serial data input port of the variable attenuator 12. The serial data lines $DIN_1$–$DIN_3$ are also shown disposed to serially feed data to successive modules 14, 16, and 20, as shown, thus providing a serial path or "daisy chain" connection of said modules. Details of construction of each of said modules will be described in conjunction with FIGS. 2–7. Suffice it to say here that digital module controller 22 is fed by a digital serial data line DATAIN, a master clock signal MCLK, as well as one or more control signals C. Such signals are used to feed beam steering information from a beam steering computer (not shown) to the digital module controller 22. Digital module controller 22 accepts formatted messages from the beam steering computer (not shown) and reformats such messages into data words to be fed to the circuits 12, 14, 16, and 20. Digital module controller also provides the control signals LTH and SHF. Typically, digital module controller 22 is comprised of CMOS, TTL or other standard logic circuits.

In response to said signals, a digital data stream is fed via line $DIN_0$–$DIN_3$ through each of the digitally controlled circuits 12, 14, 16, and 20. When the coded data on said lines are in there proper respective positions within the circuits 12, 14, 16, and 20, a LTH command is sent simultaneously to all of said circuits to latch the proper state of information into said modules. Such information is then applied to the analog portion of each of said circuits to provide selective control to the analog signals propagating therethrough. Here the amplifiers 16 and 20 provide a pair of control signals for T/R switches 27 and 28 to selectively steer a signal through the proper signal path as was briefly mentioned above.

Although a serial path connecting successive stages is shown as the technique employed to feed the control data to the circuits 12, 14, 16, and 20, it is to be understood that the serial control signal paths could be fed in parallel, for example, from the digital module controller 22 or separate digital interfaces could be provided for switches 27 and 28.

Figure 2:
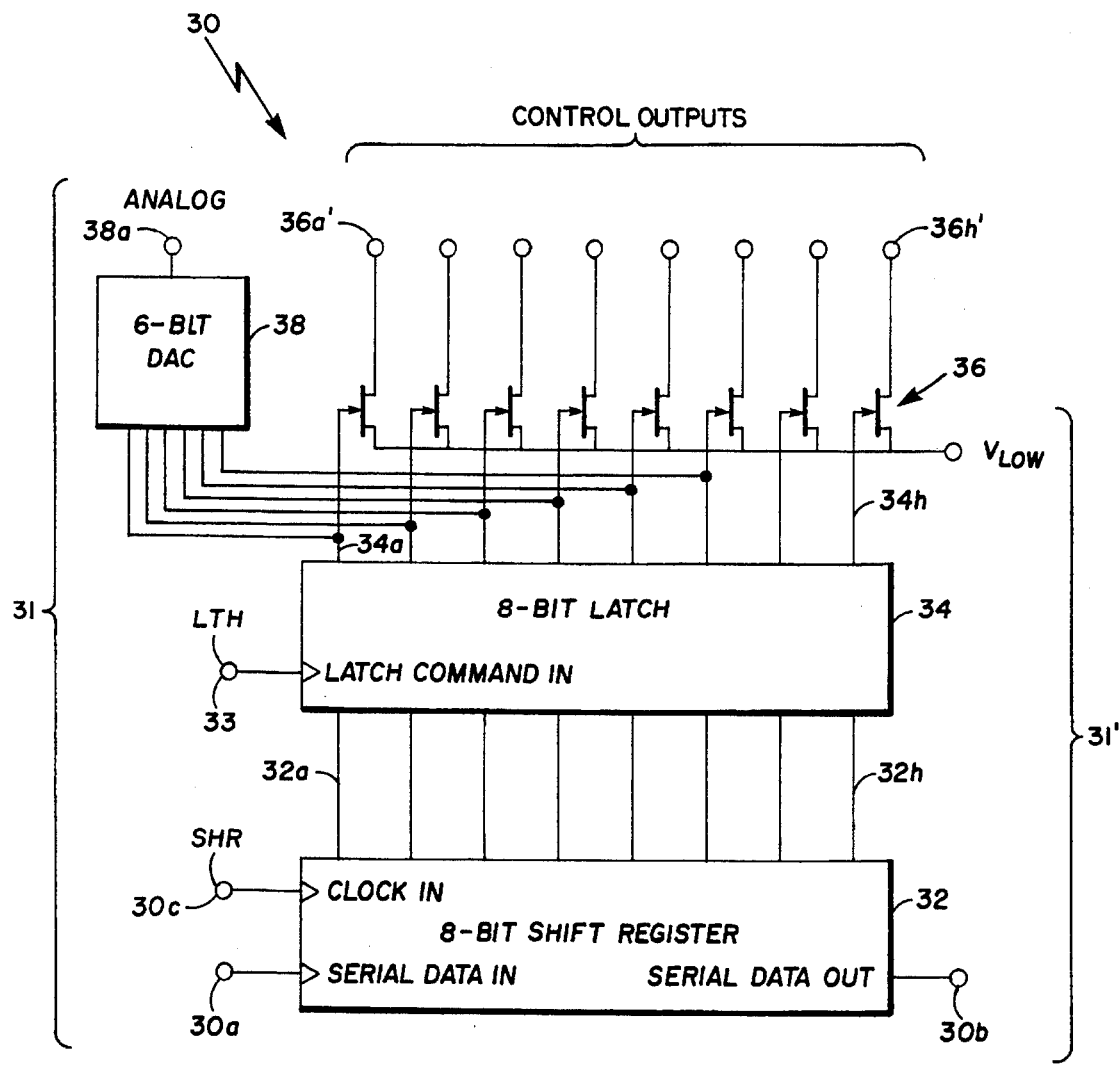
FIG. 2 is a block diagram of a digital control interface useful for providing control signals to control analog MMICS.

Referring now to FIG. 2, a digital interface 30, which provides an analog output signal at output 38a, representative of the state of a digital control signal to control MMICs having analog control inputs, as well as parallel digital signals at outputs 36a'–36h' to control MMICs having digital control inputs is shown. The interface 30 includes, here an 8-bit serial shift register having a serial input terminal 30a, a shift signal input 30c, and a serial output terminal 30b. Serial output terminal 30b is used for subsequent cascading of other circuits. The interface 30 further includes a latch 34, fed from outputs 32a–32h of shift register 32. Such circuits are generally fabricated, as will be described in conjunction with FIGS. 9–31. Briefly, here FIGS. 9–15 describe aspects of a preferred logic family suitable for integration directly with MMIC circuits, whereas FIGS. 16–31 describe a preferred process for forming digital and analog MMICs on a common substrate.

The interface operates as follows: serial data is fed to terminal 30a. The 8-bit shift register 32 responsive to the shift signal SHF fed to input 30c shifts serial data present at serial input terminal 30a through the shift register 32. After here eight or more shift cycles of signal SHF the most recent 8 bits of serial data fed to the 8 bit shift register are at the outputs 32a–32h of the shift register 32. If data are at the proper bit positions of register 32a, latch signal LTH is fed to the input 33 of latch 34 to latch or hold the last state of the data appearing at the outputs of the 8-bit shift register 32. Such data is maintained on the outputs 34a–34h of the 8-bit latch 34 as long as signal LTH is low. When signal LTH is high, the data appearing at outputs of 34a–34h will vary in accordance with the signals being shifted through the 8-bit shift register 32, that is the latch 34 is placed in a transparent mode of operation. Here the 6 MSBs (most significant bits) of the control word at the outputs 34a–34h of latch 34 are fed to a 6-bit D/A converter 38. D/A converter 38 thus provides an analog signal at output 38a which is an analog representation of the digital control word fed to D/A converter 38. Such signal is used to control analog MMICs using an analog control input. The outputs 34a–34h from latch 34 are also fed to respective gate electrodes of a plurality of transistors 36a–36h, as shown. Transistors 36a–36h provide a buffer 36 which is used to provide buffered, digital output signals or bits at terminals 36a'–36h'. The buffer transistors 36a–36h have associated bias networks and are preferably provided as output drivers, as will be described in conjunction with FIGS. 13, 14.

In accordance with the particular monolithic microwave integrated circuit being interfaced by the digital interface circuit 30, the output control signal would be either an analog signal appearing at terminal 38a or parallel digital control word appearing at terminals 36a'–36h', and accordingly, either the buffer network 36 or the D/A converter 38 may be eliminated. Thus, digital to analog interface section 31 comprised of the 8-bit shift register 32, 8-bit latch 34, and 6-bit D/A converter 38 would provide an analog control signal, whereas the 8-bit shift register 32, 8-bit latch 34, and buffer 36 would provide a digital to digital interface circuit 31'.

In general therefore, digital interface 30 would include interface circuits to interface external digital signals to the internal digital circuits, such as registers and the like, internal logic circuits to form the internal circuits, and output driver circuits to drive digital or analog inputs of the MMICs. Suitable logic circuits will be described in conjunction with FIGS. 9–15.

Referring now to FIGS. 3–6, examples of analog monolithic microwave integrated circuits including the analog circuit and digital interface disposed on a common substrate are shown.

Figure 3:
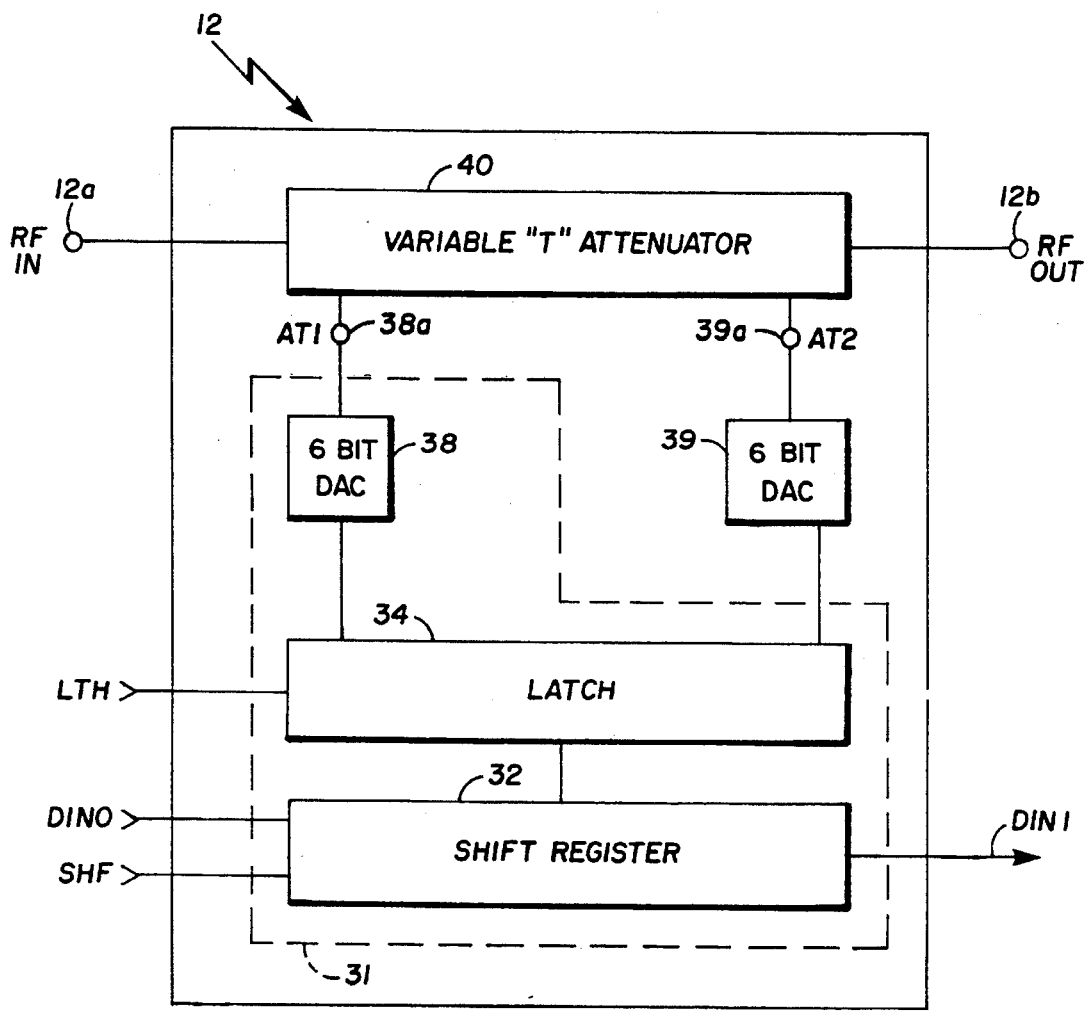
FIG. 3 is a block diagram of a variable attenuator having a digital interface incorporated on a common substrate.

Referring first to FIG. 3, a first one of said circuits, here a variable attenuator 12, used in conjunction with T/R module 10 of FIG. 1 is shown to include the interface circuit 31, that is the circuit comprised of shift register 32, latch 34, and here two 4-bit D/A converters 38, 39. The 4-bit D/A converter 38 provides a first control signal $AT_1$, whereas the second 4-bit D/A converter 39 provides a second control signal $AT_2$. Such signals are fed to a variable T type attenuator network 40. Network 40 is comprised of MESFET transistors (not shown) which are fed variable gate biases to control channel resistance between source and drain electrodes to provide variable attenuation in accordance with conventional techniques. Alternatively, such network can be comprised of T sections of switched resistors and would be fed by the digital control interface 31'.

To control the attenuator 12, a serial data stream on line $DIN_0$ is fed into the shift register 32 and is shifted through the shift register 32 in response to signal SHF. After the data are in the proper bit positions for the attenuator, as well as other circuits which are "daisy chained" together (circuits 14, 16, and 20 (FIG. 1) as will be described), the latch 34 is activated by placing signal LTH in a latching state, thus latching the data in the latch 34. The data in latch 34 are applied to D/A converters 38 and 39 to provide analog control signals $AT_1$ and $AT_2$. A variable attenuation of an RF signal fed via input terminal 12a to output terminal 12b is provided in accordance with values of $AT_1$ and $AT_2$ applied to conventional network 40. Alternative arrangements are possible. For example, attenuator 12 may be of a type where switched resistors are used to provide variable attenuations. In such a case, digital signals from digital interface 31' would be used. Further, it may only be necessary for certain types of attenuators to provide a single analog signal.

Figure 4:
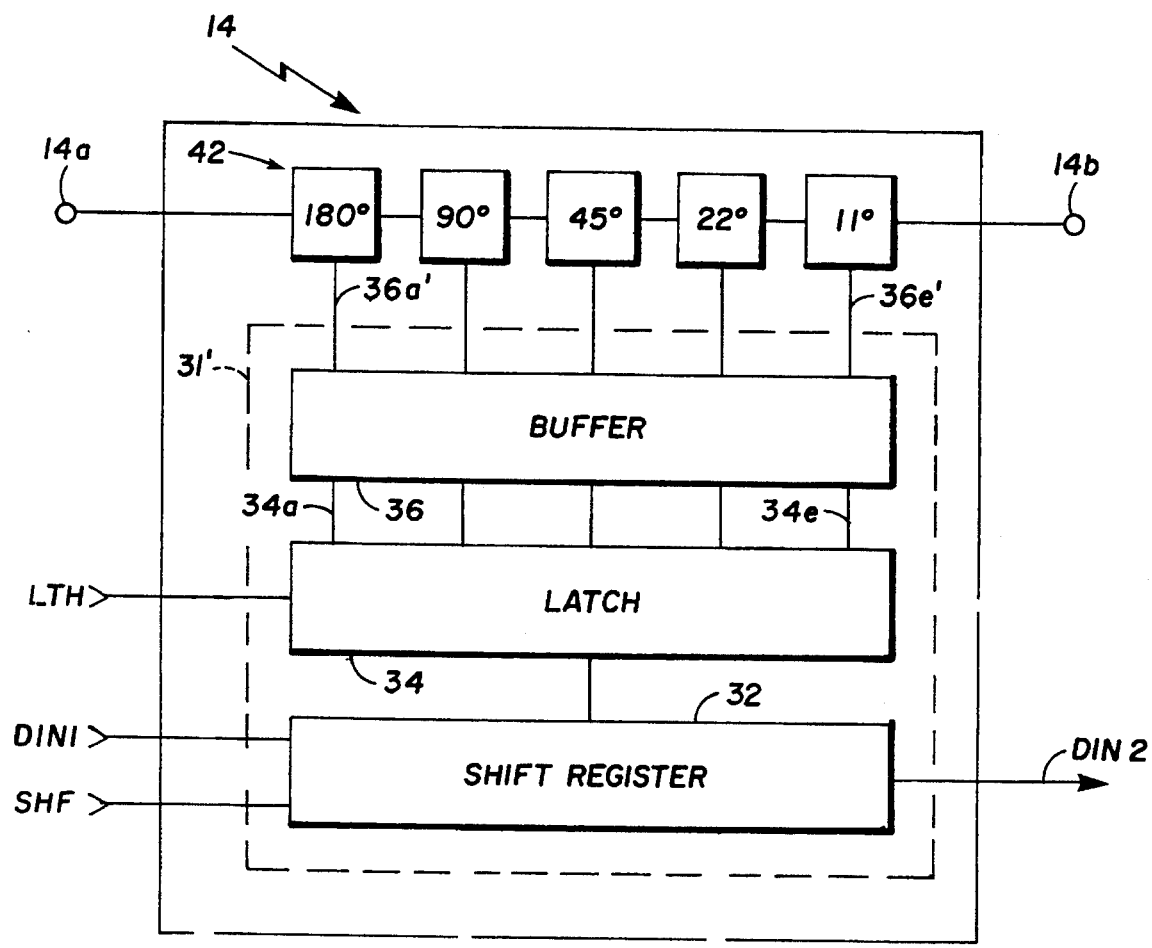
FIG. 4 is a block diagram of a variable phase shifter having a digital interface incorporated on a common substrate.

Referring now to FIG. 4, a variable phase shifter 14 is shown to include the interface circuit 31' comprised of shift register 32, latch 34, and buffer or driver network 36. Again, serial data, here from input $DIN_1$ is fed to serial register 32 and shifted through register 32. A latch command signal LTH is again provided to the latch 34 to hold the state of the 8-bit word at the output of the latch 34 after the data are in their proper bit locations. These latched signals are fed to the buffer 36. The signals from buffer 36 are applied to a digital control phase shifter 42. Phase shifter 42, likewise is any conventional MMIC implemention. For example, phase shifter 42 may include switched phase shift segments. Alternatively, the phase shifter may be an analog controlled phase shifter and would use interface circuit 31. Here, the phase shifter 14 is digitally controlled and, in accordance with the state of the control signal, selected ones of the signal paths corresponding to 180°, 90°, 45°, 22.5°, and 11.25° differential phase shifts are selectively activated or de-activated to provide a variable phase shift to a signal fed between terminals 14a and 14b.

Figure 5:
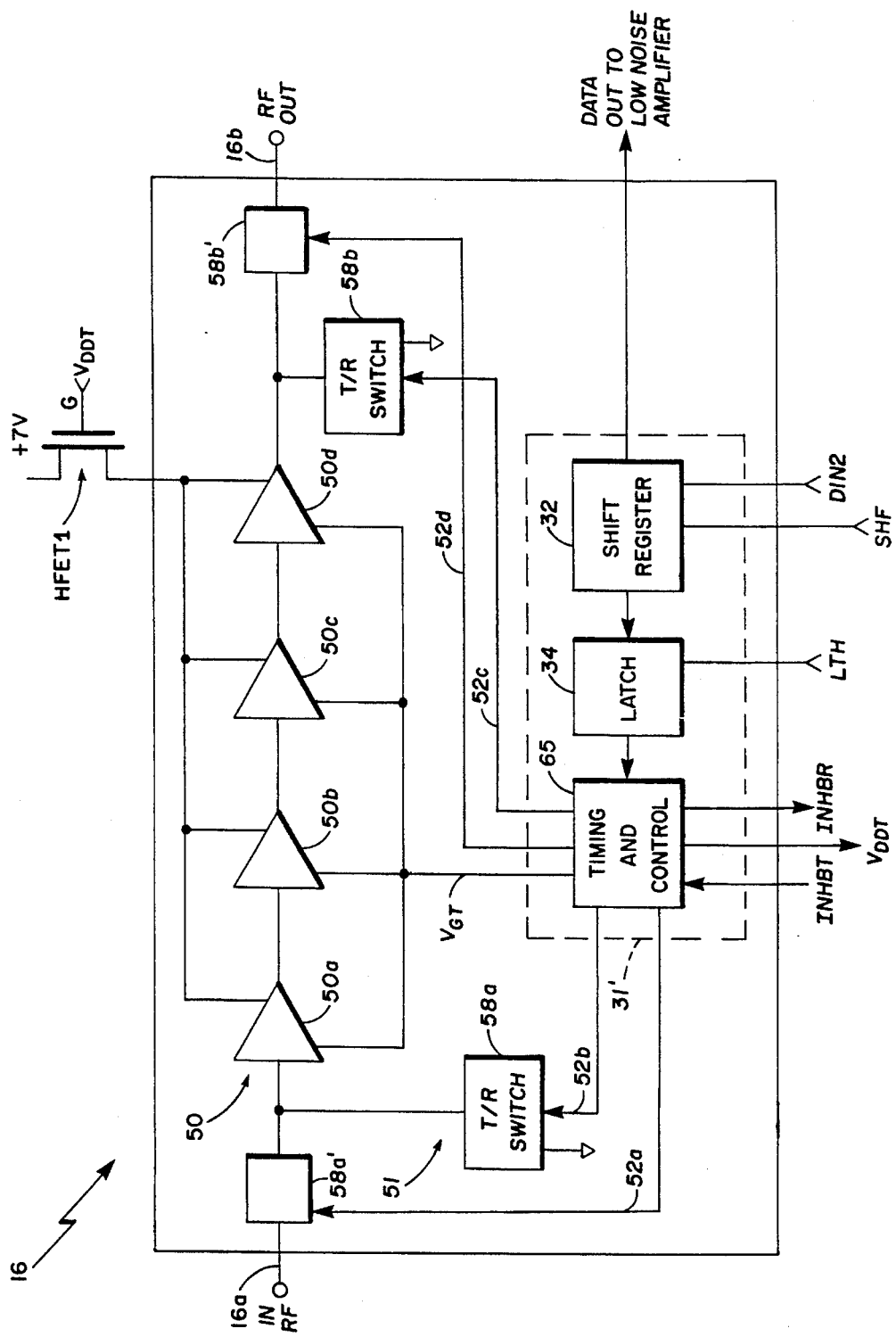
FIG. 5 is a block diagram of a high-power amplifier having a digital interface incorporated on a common substrate.

Referring now to FIG. 5, a switchable power amplifier 16 for use in the T/R module 10 (FIG. 1) is shown to include the interface circuit 31' as described in conjunction with FIG. 2, which in response to a serial input data stream, here along line $DIN_2$, SHF and LTH signals provide digital control data at the output of latch 34. Here the digital control data are fed to timing and control network 65. Network 65 provides handshaking signal INHBR and is responsive to a handshaking signal INHBT (from amplifier 20) to control shunt T/R switches 58a and 58b, series T/R switches 58a', 58b' and amplifier chain 50 via digital signals fed on lines 52a–52d and $V_{GT}$, $V_{DDT}$, respectively as shown. Amplifier chain 50 includes here 4 individual amplifiers 50a–50d. Drain bias switching is provided by feeding a signal on line $V_{DDT}$ of appropriate voltage levels provided by a level shifter (not shown) to switch a high power transistor HFET1 such as a HEXFET (International Rectifier, Inc.) to supply $V_{DD}$ to the amplifier 50, as shown. The HEXFET is located off of the substrate but within the T/R module.

The T/R switches 58a, 58a', 58b, and 58b' are used to isolate terminals 16a, 16b in a receive mode of operation of the device, and to couple an amplified signal fed at terminal 16a through said amplifier chain 50 and appear at terminal 16b during a transmit mode of operation of said device as will be described in conjunction with FIG. 8. Here said switches 58a, 58a', 58b, 58b' are SPST type and are used in place of SPDT T/R switches 27, 28 (FIG. 1). The T/R switches 58a, 58a', 58b, 58b' are integrated on the same substrate as amplifier 16 without using an additional digital interface circuit 31'. Alternatively, T/R switches 27, 28 (FIG. 1) may be provided with their respective digital interfaces 31'. Another variation would be to have control signals supplied by a digital interface 31' disposed on one of the modules 12, 14, 16, or 20, control the SPDT switches 27, 28. An alternate embodiment 10' of the T/R module using only SPST type switches will be described in conjunction with FIG. 7.

Figure 6:
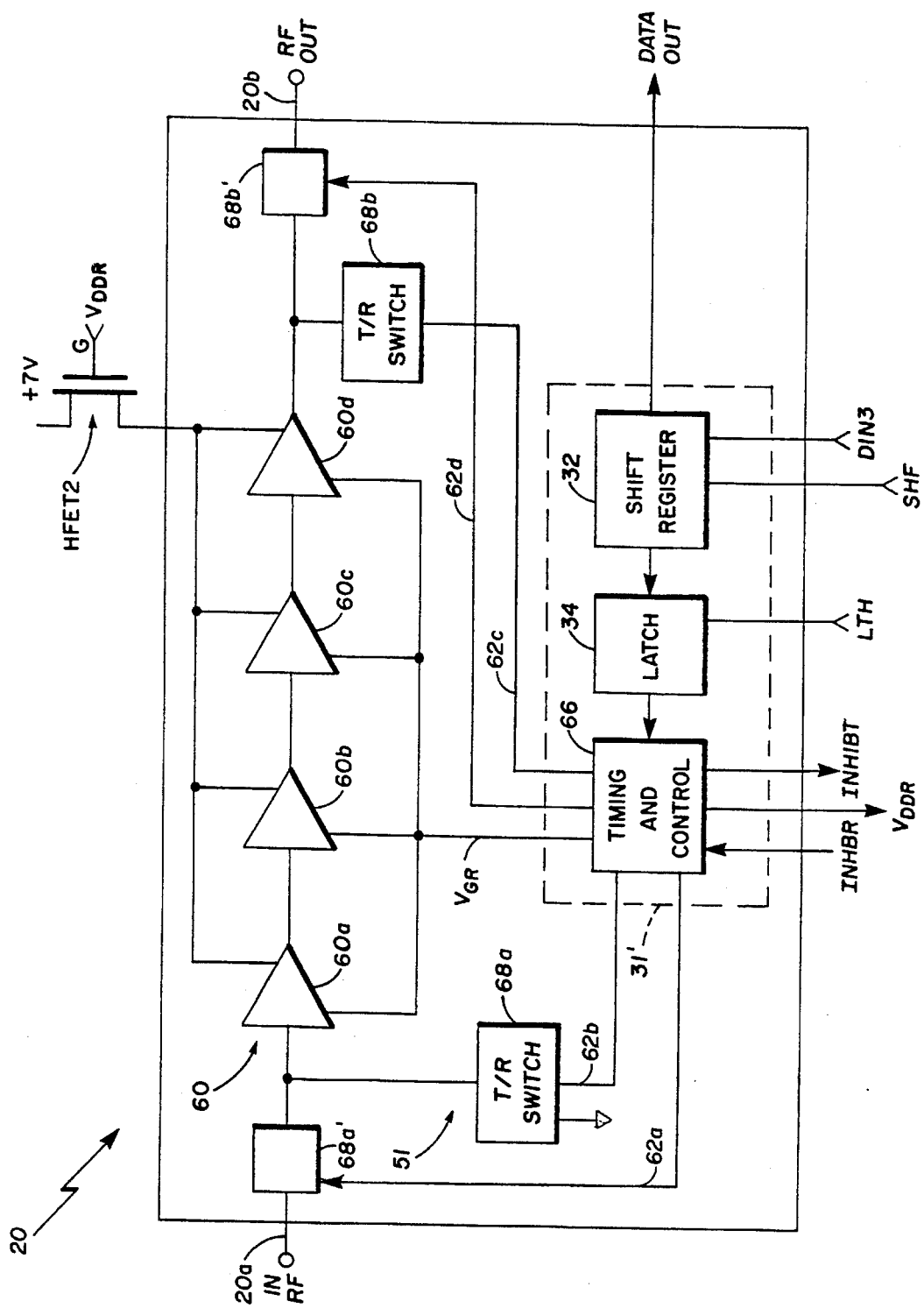
FIG. 6 is a block diagram of a low-noise amplifier having a digital interface incorporated on a common substrate.

Referring now to FIG. 6, a low-noise amplifier 20 is shown to include the interface network 31', which operates in a similar manner as network 31' of FIG. 5. The amplifier 20 includes an amplifier chain 60 with drain bias switching via HFET2 as that described in conjunction with FIG. 5. The amplifier further includes T/R switches 68a, 68a', 68b, and 68b' provided to couple signals to the amplifier 60 during a receive mode and to isolate the input and output of the low-noise amplifier chain 60 during transmit mode. The chain 60 is here comprised of individual amplifier sections 60a–60d. Amplifier 60 has timing and control network 66 to provide signals 62a–62d, INHBT, $V_{DDR}$ and $V_{GR}$ to provide gate and drain switching and signal path switching, as will be mentioned.

In many practical T/R circuits, it is important that the low noise receiver amplifier 20 and the high power transmit amplifier 16 not operate simultaneously, since would burn out the receiver amplifier 20. Further, in the scheme above, it is generally desirable to bias the gates of the power amplifier at a $V_{GS}$ of OV to provide a good termination for the port of a circulator (FIG. 8) connected to the power amplifier. Normal operation of the power amplifier uses a $V_{GS}$ bias at a negative voltage. If drain bias $V_{DD}$ is present while $V_{GS}$ is at OV, the power amplifier 16 will burn out. By providing a digital interface circuit 31', it is now possible to provide digital timing and control to sequence signals to control application of bias voltages to the amplifier. It is also possible to provide handshaking signals to prevent the amplifiers from operating simultaneously.

Here two bits of data from the latch 34 in each interface 31' of each amplifier 16 and 20 are fed to respective timing and control circuits 65, 66 to provide signals to time the turning "on" and "off" of amplifiers 16 and 20.

Two handshaking signals INHBT, INHBR are generated from the bits of data from latch 34. INHBT is provided from the timing and control circuit 66 in the receiver amplifier and is fed to the timing control circuit 65 of the transmit amplifier 16 to inhibit the transmitter from operating while the receiver amplifier 20 is operating. If INHBT is asserted, it will inhibit the transmitter amplifier 16 despite the state of the bits of data provided at the output of latch 34 in the transmitter amplifier 16 (FIG. 6). Only after the corresponding bits in latch 34 (FIG. 6) in the receiver amplifier 20 have had sufficient time to deactivate the receiver amplifier 20 will the timing and control logic 66 reset INHBT to deassert it, and thus permit the transmit amplifier 16 to turn on. Similarly timing and control logic 65 will assert INHBR to inhibit the timing and control logic 66 of the receiver amplifier while the transmit amplifier is turned on.

Each timing circuit also provides a nominal delay between switching of the state of the gate bias voltage control signals $V_{GT}$ and $V_{GR}$ and the drain bias control signals $V_{DT}$, $V_{DR}$ to insure that the drains are turned on only after the gates of the respective amplifiers are properly biased here at a negative potential.

The circuits described in conjunction with FIGS. 2–6 are fabricated as digital/monolithic microwave integrated circuits. In particular, each analog portion of the circuit, is formed as a microwave monolithic integrated circuit or millimeter monolithic integrated circuits on a Group III–V material substrate, such as gallium arsenide. Using the variable phase shifter 12 (FIG. 4) as an illustrative example, the phase shifter 12 has an analog MMIC phase shifter portion and a digital interface circuit 31' formed on the same substrate. The digital interface circuit 31' includes digital interconnects also formed on the substrate. The digital interconnects are patterned strip conductors and are used to feed control signals to the analog MMIC circuit. This arrangement eliminates the need for separate bond wires to interconnect the digital and analog circuits. A particular implementation of such a circuit using a logic family and process, as will be described, is shown in FIG. 7.

Figure 7:
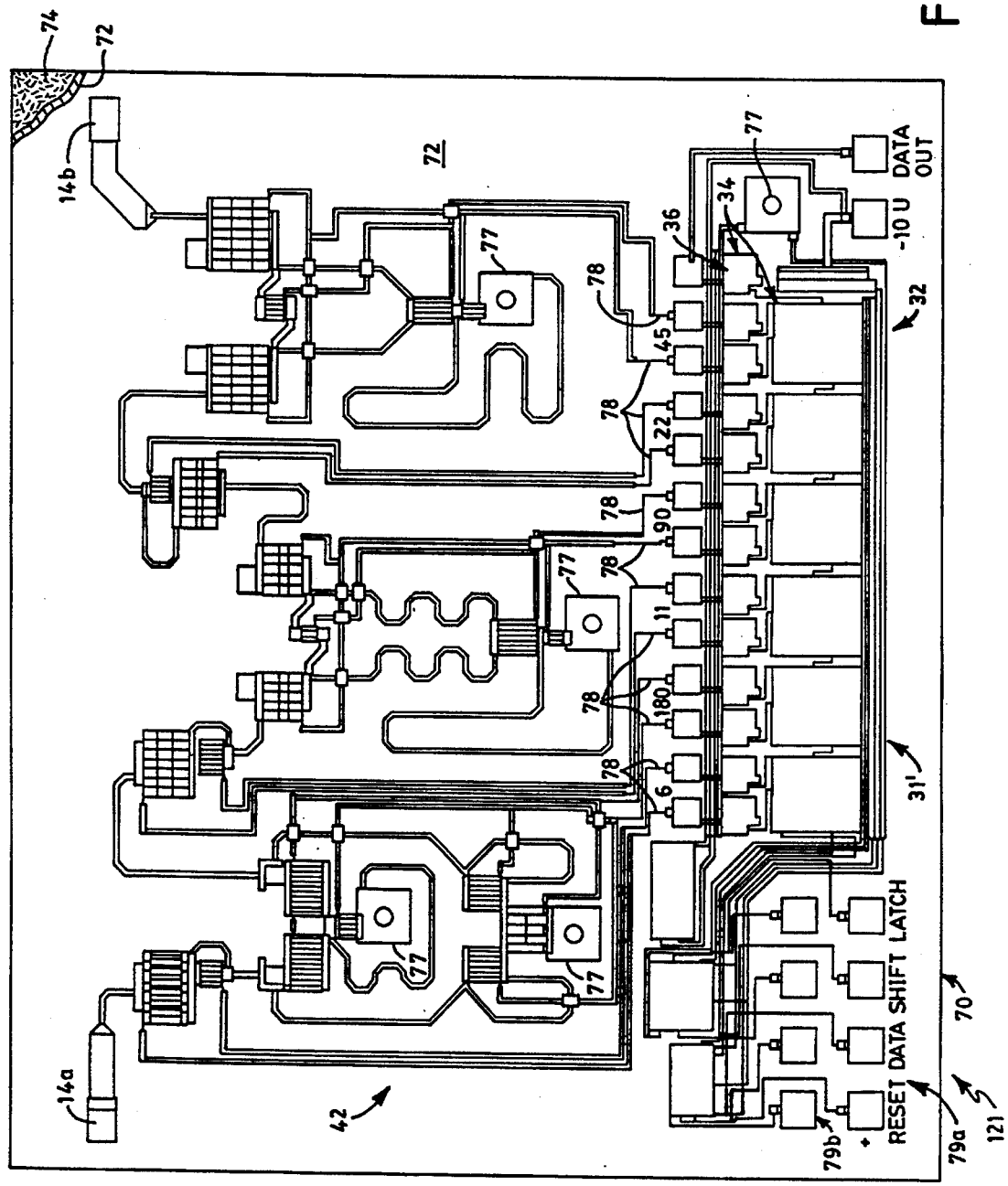
FIG. 7 is a plan view of a phase shifter having a digital interface in accordance with an aspect of the present invention.

Referring now to FIG. 7, a phase shifter 12 (FIG. 4) fabricated as a monolithic microwave integrated circuit 70 including a digital interface 31' (FIG. 4) and a bit switched, here six bit analog phase shifter 42 (FIG. 4) is shown. The circuit 70 is fabricated on a substrate 72, here of semi-insulating gallium arsenide having disposed over a first surface thereof a ground plane conductor 74. Disposed over a second opposite surface thereof is the circuit 70. The analog phase shifter 42 section is here implemented by lengths of transmission line and switching MESFETs (metal semiconductor field effect transistors) (not numbered).

The analog phase shifter 42 receives control signals along digital interconnections 78 coupled between output drivers 36 and phase shifter 42.

It should also be noted that the shift register 32 and latch 34 are here 6 bits in length, the same length as the number of bits in the phase shifter 42. In the implementation shown in FIG. 7 input terminals are provided for the latch signal LTH, shift signal SHF and data input signal DATA. A digital interface Reset is also provided to clear the shift register. Such signal would also be fed from the digital module controller 22. A drain bias of −10 V for the logic circuit is applied at terminal −10 V and output serial data are fed from terminal DATA out. Additionally, a top level ground is provided by vias 77 to interconnect grounded portions of transistors as required to the ground plane conductor 72. Inputs RESET, DATA, SHIFT, and LATCH are here also provided to interface either positive CMOS logic (pads 79a) or negative CMOS logic (pads 79b). Such signals are fed to respective CMOS level shifting and interface circuits, as will be described.

Referring now to FIGS. 8, 8A, 8B, 8C, 8D, 8E and 8F a preferred implementation 10' of the transmit/receive module 10 (FIG. 8), is here shown having shift registers in each one of the interface circuits 31, 31' (as required) of each one of the circuit modules 12, 14, 16, and 20 interconnected in a serial chain. Here the circuits 16 and 20 incorporate on chip T/R switches 58a, 58a' 58b, 58b', and 68a, 68a', 68b, 68b', respectively as described above. Moreover, a circulator 28 which can be of a discrete or integrated type is here is used to steer signals between the pair of amplifiers 16, 20 and the radiating element 29. The circulator 28 is preferred over a T/R switch (as in FIG. 1) to provide further isolation to the receiver amplifier 20 input during transmit.

In operation, input data is fed to the digital module controller 22. The digital module controller 22 decodes the incoming data and determines whether the incoming data corresponds to the particular transceiver module 10', as is well known. If the address of such data corresponds to the module 10', then such data will be serially formatted and coupled to line $DIN_0$. Control signals LTH and SHF will be generated to shift such data serially through said shift register 32 to the output of said shift register and onto the next shift register in phase shifter 14. Such data will be shifted on to the high-power transmit amplifier shift register 32 and the low-noise receiver amplifier shift register 32 in turn. Here each one of said shift registers are shown as 8-bit shift registers. Alternatively, the number of bits in the register may correspond to the; number of actual control bits needed by a particular circuit.

Here, after 32 bits of valid data information are fed from the digital module controller 22, such bits of valid digital information will be in the respectively proper locations of each one of the respective shift registers 32 of circuits 12, 14, 16, and 20, as illustrated by the timing diagram shown in FIG. 8A, 8B, 8C, 8D, 8E, and 8F. After the "32nd" shift pulse on SHF, each one of the registers in the T/R module 10 will present valid data to the latches 34 and a latched signal LTH is fed to each one of the latches in the interface to latch or hold data presented to the inputs of the latch. The latched signals are applied to the buffers or the D/A converters, as required. After the data is latched, the shift pulse is gated off. The signals control the T/R module 10 by varying the attenuation of a signal passing therethrough, inpart a variable phase shift to a signal passing therethrough, switch the signal through the high-power amplifier stage for a transmit mode, or through the low-noise amplifier stage during a receive mode and provide the requisite handshaking signals INHBT, INHBR, and bias switching signals as described earlier.

Referring now to FIGS. 9-14, a logic family suitable for integration with monolithic microwave integrated circuits formed on gallium arsenide or other group III–V substrates using depletion mode metal semiconductor field effect transistors and thus suitable as the logic circuits for the interfaces 31, 31' of FIGS. 2–8 above is shown.

Figure 9:
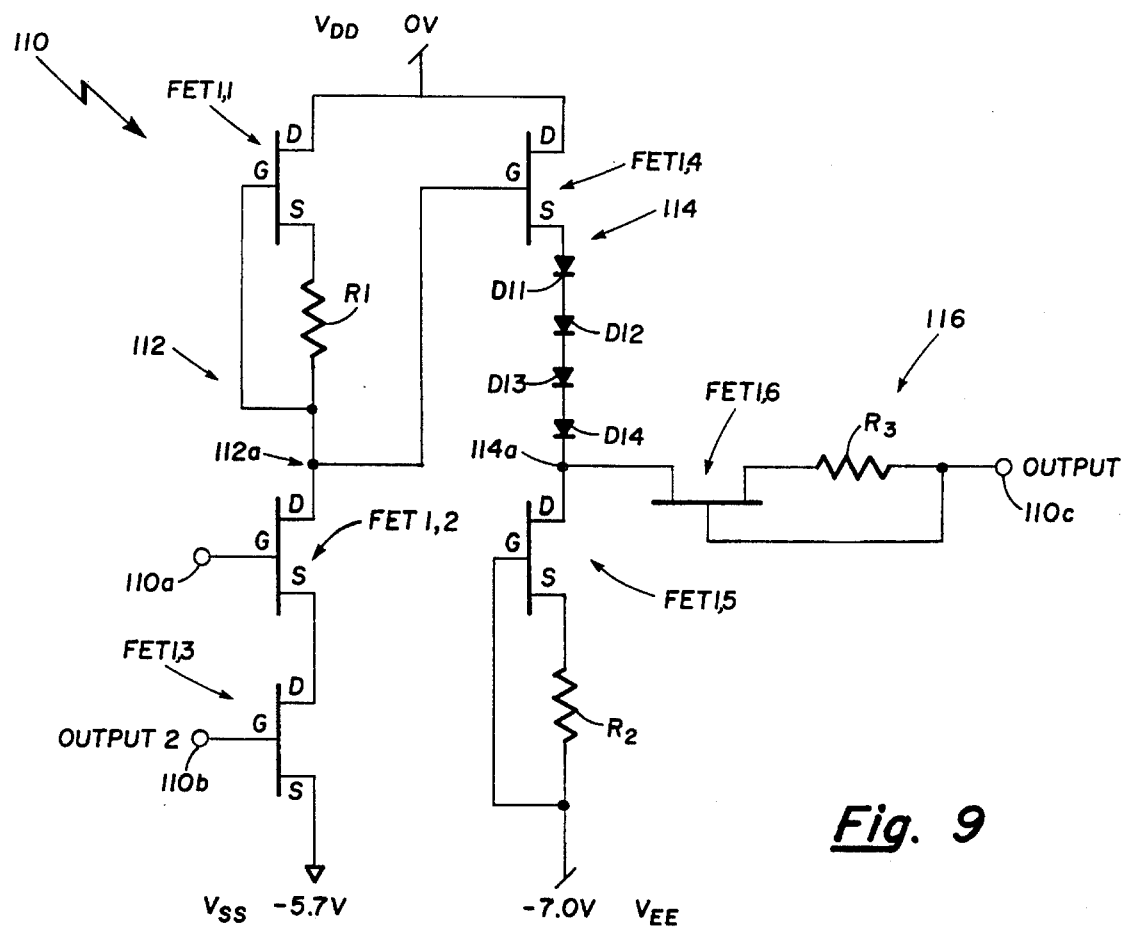
FIG. 9 is a schematic diagram of a NAND gate representative of a logic family suitable for providing digital control circuits on a common substrate with analog monolithic microwave integrated circuits.

Referring first to FIG. 9, a digital monolithic microwave integrated circuit gate, here a NAND gate 110 is shown to include a first branch 112, here a logic branch including a load transistor FET 1,1, having a drain electrode (D) coupled to a drain supply $V_{DD}$, a source electrode (S) coupled to a resistor $R_1$ used to reduce branch currents and a gate electrode (G) coupled to the opposite end of the resistor $R_1$, as shown. The presence of resistor $R_1$ effectively decreases the width of the FET 1,1, and concomitantly reduces the current capability of the FET 1,1. This arrangement is also true for all such arranged FETs to be described. Here a pair of input transistors, FET 1,2–FET 1,3 are shown coupled in series, that is with the drain electrode of transistor FET 1,2 coupled to the resistor $R_1$, the source electrode thereof coupled to the drain electrode of transistor FET 1,3 and the source electrode of FET 1,3 coupled to a supply $V_{SS}$. This logic branch provides a NAND gate logic function since if either one of the inputs 110a, 110b are fed a logic low-level, the output at terminal 116 of the gate 110 will be a logic high regardless of the logic level at the other input, whereas if both of the inputs 110a, 110b are logic high-levels, the output at terminal 116 will be a logic low.

The NAND gate 110 further includes a buffer or level shifter branch 114. Branch 114 includes a first transistor FET 1,4 in a "source follower" configuration having a gate electrode connected to the drain electrode of the first one of the input transistors FET 1,2, to connect the logic branch 112 to the buffer branch 114, as shown. The source follower transistor FET 1,4 has its drain electrode connected to supply VDD and its source electrode connected through here 4 forward voltage diode drops provided by diodes $D_{11}$–$D_{14}$ to a current sink transistor FET 1,5. FET 1,5 has its drain electrode coupled to the last one of said diodes $D_{14}$, a source electrode coupled to a second resistor $R_2$, and having its gate electrode coupled to other end of resistor $R_2$ and supply $V_{EE}$, as shown. Resistor $R_2$ is provided to reduce branch currents in buffer branch 114 as described above for the logic branch 112. An output branch 116, here includes a series coupled transistor FET 1,6, having its drain electrode coupled to the drain electrode of transistor FET 1,5 and a source electrode coupled to a third resister $R_3$ to reduce output currents in output branch 116.

In operation, voltage levels corresponding to −3.1 volts for a logic one and −7.0 volts for a logic zero, are fed to inputs 110a, 110b from other logic gates or an input level shifting circuit, as will be described in conjunction with FIGS. 9–11.

In response to a logic low-level of −7.0 volts fed to either one of inputs 110a, 110b, the corresponding transistor FET 1,2–1,3 will be placed in a pinch off mode, that is the transistor will provide a substantially open circuit between the source and drain electrodes, thus inhibiting the load resistor and FET 1,1 from conducting. This condition when applied to the buffer branch 114 will force the output at 110c to be placed in a logic one state. Conversely, when both of the inputs 110a, 110b are fed logic one levels of here −3.1 volts, each one of said transistors will be placed in a conducting state, thereby providing a voltage at the junction 112a corresponding to $V_{SS}$ minus 2 voltage drops or approximately −5.3 volts. This voltage when fed to the buffer branch 114 and the output branch 116 will cause the output 110c to be placed in a logic zero state.

Figure 9A:
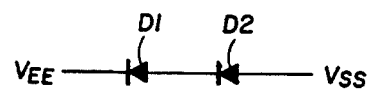
FIG. 9A is a schematic diagram showing a preferred approach to provide a supply voltage for the circuit in FIG. 9.

As also to be noted, the buffer branch 114 has a relatively poor source follower where variations of input voltage at the gate provide somewhat corresponding variations at output voltage of the transistor FET 1,4. Thus, at source electrode of FET 1,4, voltage level swings from zero to minus 5 volts are provided in accordance with the logic state fed at the output of the logic branch 112. Four diodes $D_{11}$–$D_{14}$ insure a voltage drop of 2.4 volts between the voltage at the source electrode of FET 1,4 and the node 114a. Thus, the 4 diode drops insure that the current sink will be turned off and provide a voltage across the current sink of nearly zero for voltages levels corresponding to a logic low. Thus, no current will be forced through the current sink transistor FET 1,5. Nevertheless, transistor FET 1,4 even when output 110c is in a logic low state must source a leakage current of here 70 microamps through transistor FET 1,5 and transistor FET 1,6. Since $V_{SS}$ is approximately 2 diode drops removed from $V_{EE}$, 2 diodes may be placed between voltage source $V_{EE}$ and the source terminal of transistor FET 1,3 to generate the requisite −5.7 volt supply, as shown in FIG. 9A. Since the total current required to be supplied from voltage source $V_{SS}$ is typically less than 10 milliamps for a circuit containing 100 gates or less, in such applications the use of 2 diodes in series would be appropriate. Generating the supply voltage VSS on chip would eliminate additional bonding pads and the system requirement for an additional externally generated power supply. Sharing of the on-chip generated $V_{SS}$ between various circuits is also possible.

Nominal power supply voltages, which can be used in the NAND gate circuit 110 are $V_{DD}$ of zero volts and $V_{EE}$ equal to −7.0 volts. Holding $V_{DD}$ fixed at zero volts, $V_{EE}$ can vary from −5 volts to approximately −10 volts and below, the limit of the voltage source $V_{EE}$ being determined principally by the breakdown voltage of the FETs used in the circuit, without any substantial effect on circuit operation other than power dissipation which is directly proportional to supply voltage difference. Since the VSS supply remains at 2 diode voltage drops above VEE, the logic low continues to clamp to the negative supply and a maximum of about 6 volts will appear across the output current limiter transistor FET 1,5 for the largest supply voltage difference.

As mentioned, the circuit shown in FIG. 9 is a NAND gate. Removal of transistor FET 1,3, for example, and connection of the source electrode of transistor FET 1,2 to $V_{SS}$ will provide an inverter.

The arrangement shown in FIG. 9 is the internal logic gates of a digital monolithic microwave integrated circuit, particularly for use in controlling analog MMICs. Typically, however, such circuits must interface to other digital logic family circuits, for example, CMOS, negative CMOS, ECL, and TTL. Generally, these families are used to construct the digital module controller 22 (FIG. 2), as well as the beam steering computer (not shown).

Figure 10:
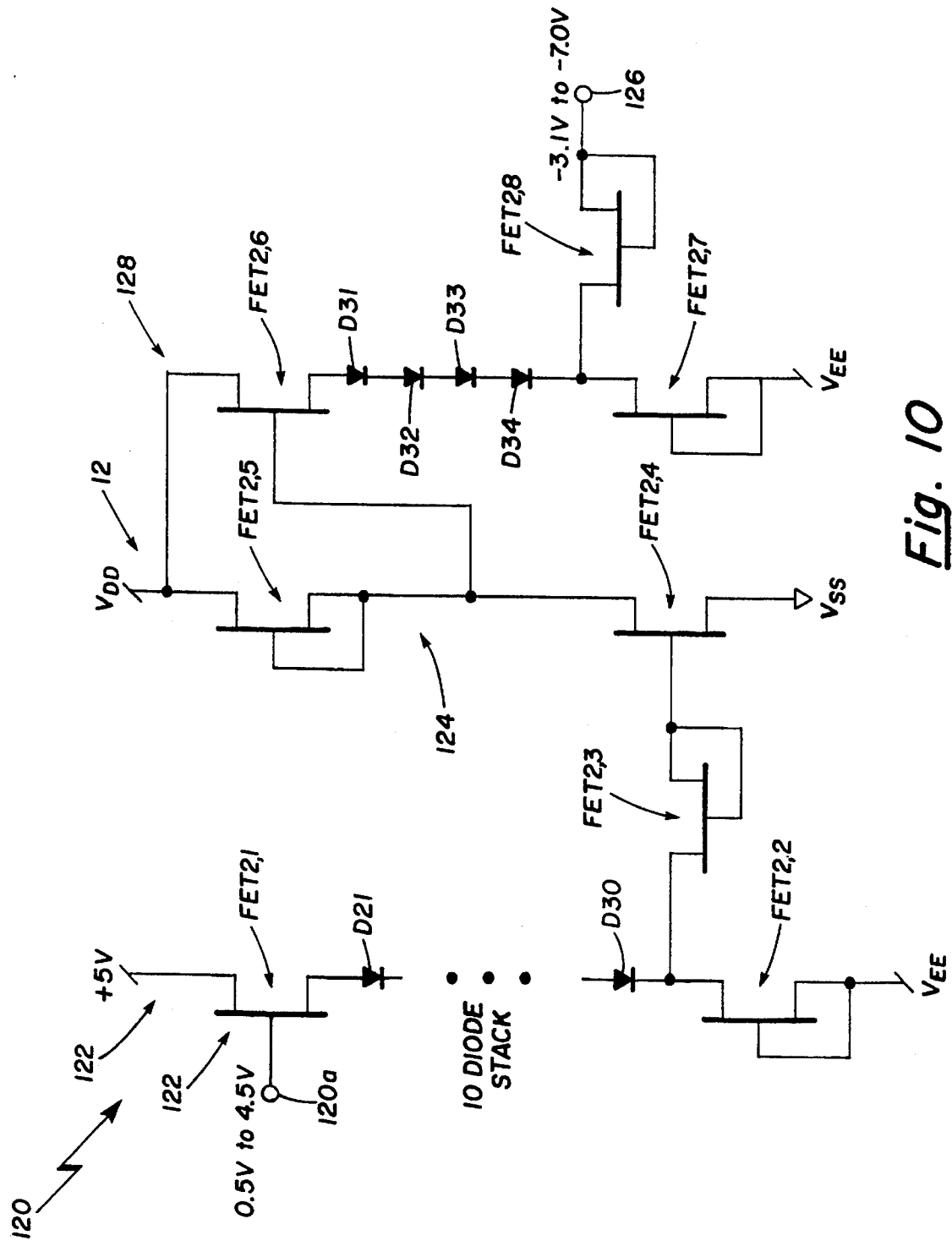
FIG. 10 is a schematic diagram of a CMOS input level shifter to interface the logic gate depicted in FIG. 9 to signals provided from CMOS circuits.

Referring now to FIG. 10, an input interface circuit 120 suitable for complimentary metal oxide semiconductor (CMOS) logic and thus which provides CMOS input voltage levels between zero and 0.5 volts for a logic zero and 4.5 to 5 volts for a logic one is shown to include a input branch 122 including source follower FET 2,1 having a drain electrode connected to a power supply of +5 volts the drain supply for CMOS logic circuits and having its source electrode connected via a stack of 10 level shifting diodes $D_{21}$–$D_{30}$ to a transistor FET 2,2, here used as a current sink. The drain electrode of the transistor FET 2,2 is connected via a transistor FET 2,3, as shown, to a embedded inverter section 124 including transistors FET 2,4–FET 2,7, as shown. The inverter 124 is used to improve drive capability and gain. For an input interface circuit 120 that will drive a small number of inputs, the transistors of the embedded inverter can be of relatively small dimensions. For an input interface circuit that will drive a large number of inputs, such as a clock for a shift register, the transistors in the embedded inverter 124 are sized up appropriately. The output terminal 126 of the input interface circuit 120 is coupled to the drain of FET 2,7 via a series coupled transistor FET 2,8 having its gate coupled to terminal 126 as shown. Transistor FET 2,8 acts as a current limit device.

Figure 11:
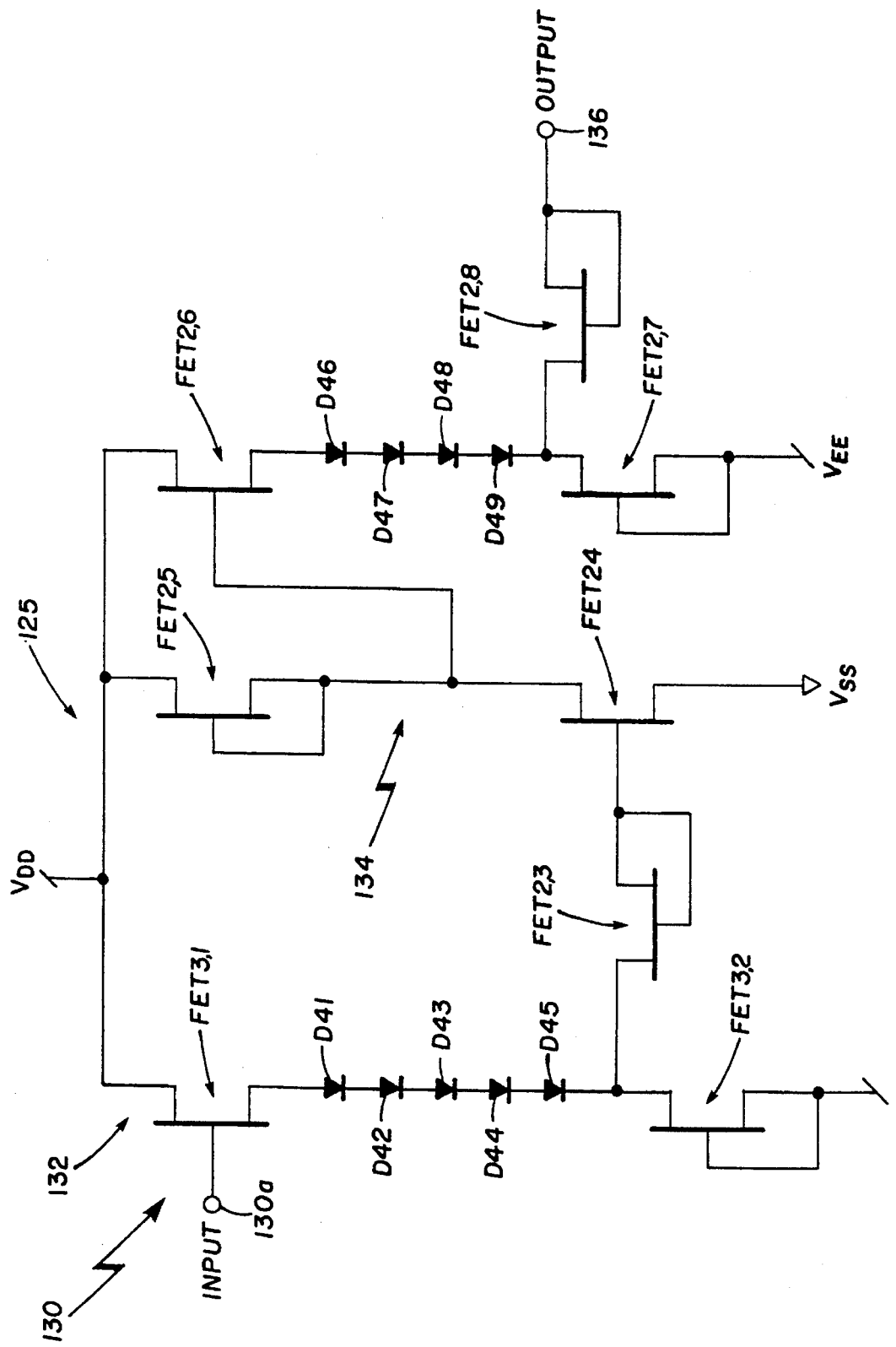
FIG. 11 is a schematic diagram of a negative CMOS input level shifter to interface the logic gate depicted in FIG. 9 to signals provided from negative CMOS circuits.

Referring now to FIG. 11, a interface circuit 130 for negative CMOS input logic is shown to include an arrangement as generally described above in conjunction with FIG. 10 for the CMOS input interface circuit 120. Here, however, the input branch 132 has a stack of 5 diodes $D_{41}$–$D_{45}$, as shown. Here the number of level shifting diodes is changed to provide the appropriate input voltage levels from the input branch 132 to the embedded inverter 134 comprised of transistors FET 2,4–FET 2,8, as described above.

Figure 12:
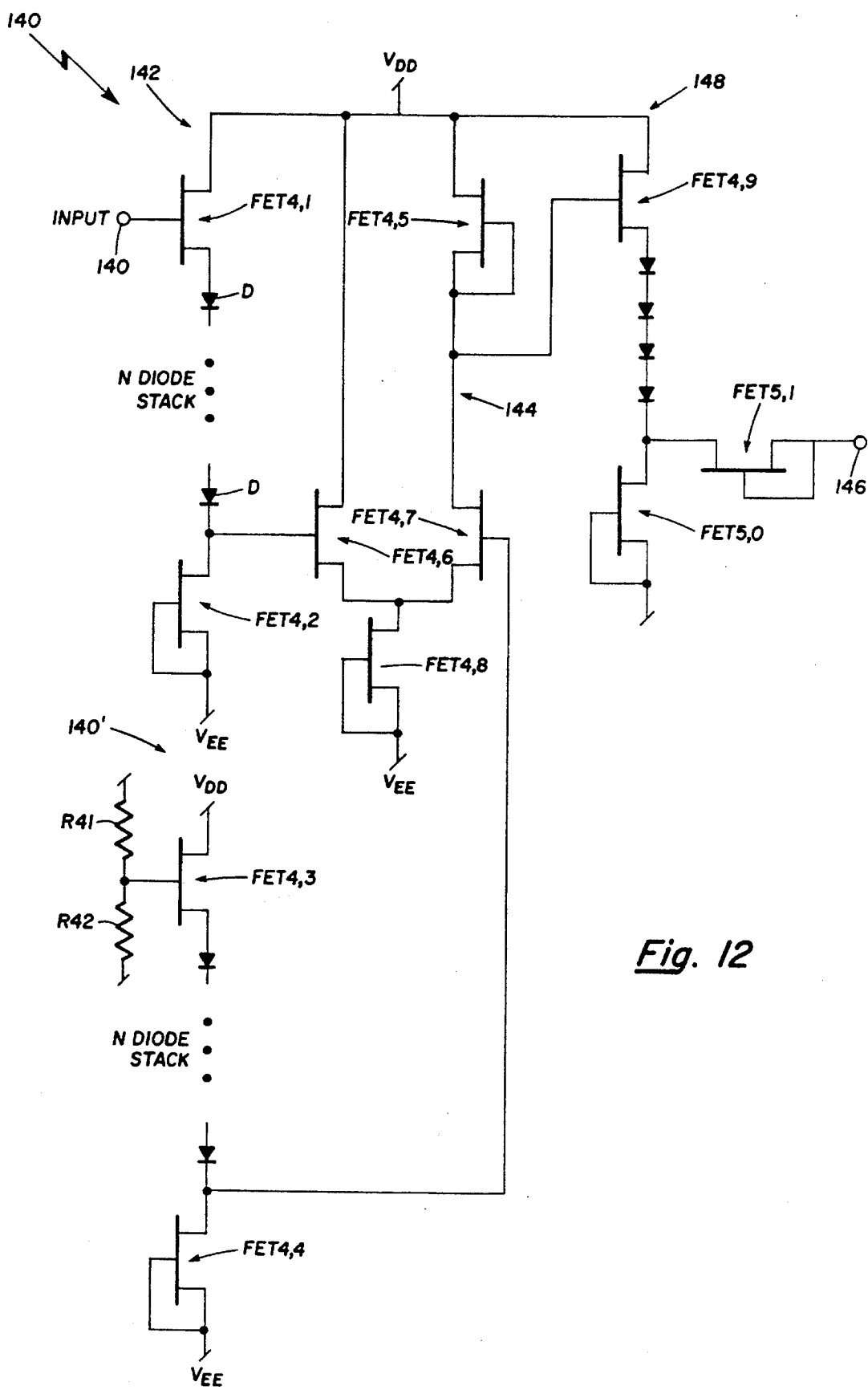
FIG. 12 is a schematic diagram of a ECL input level shifter to interface the logic gate depicted in FIG. 9 to signals provided from ECL circuits.

Referring now to FIG. 12, an input circuit acceptable for receiving emitter coupled logic (ECL) input logic levels is shown to include a input circuit including an input buffer branch 142 comprised of a source follower transistor FET 4,1 coupled to a current sink transistor FET 4,2 via an N-diode stack, as shown where N depends on the choice of voltages for power supplies $V_{DD}$, $V_{EE}$. The output of the source follower is connected to a first input of a differential amplifier 144 comprised of transistors FET 4,6 FET 4,7, as also shown, said amplifiers having source electrodes connected in common to a second current sink FET 4,8, as shown. The second input of the differential amplifier 144 is coupled to a second input branch 140' identical to that described above except that the source follower transistor FET 4,2; has a gate electrode coupled to a reference potential set to a midpoint voltage of the input voltage logic levels. This reference potential is generated either internally or externally.

With this configuration, temperature induced voltage variations in the diodes of the input branch 140 are compensated for by corresponding variations in the second input branch 140'. The drain electrode of FET 4,7 is connected to a buffer branch 148 comprised of a second source follower FET 4,9 coupled, via a second stack of here 4 diodes, to a current sink FET 5,0 and a current limit transistor FET 5,1. Current limit transistor 5,1 is coupled between the drain of the current sink and an output terminal 146, as shown.

Figure 8:
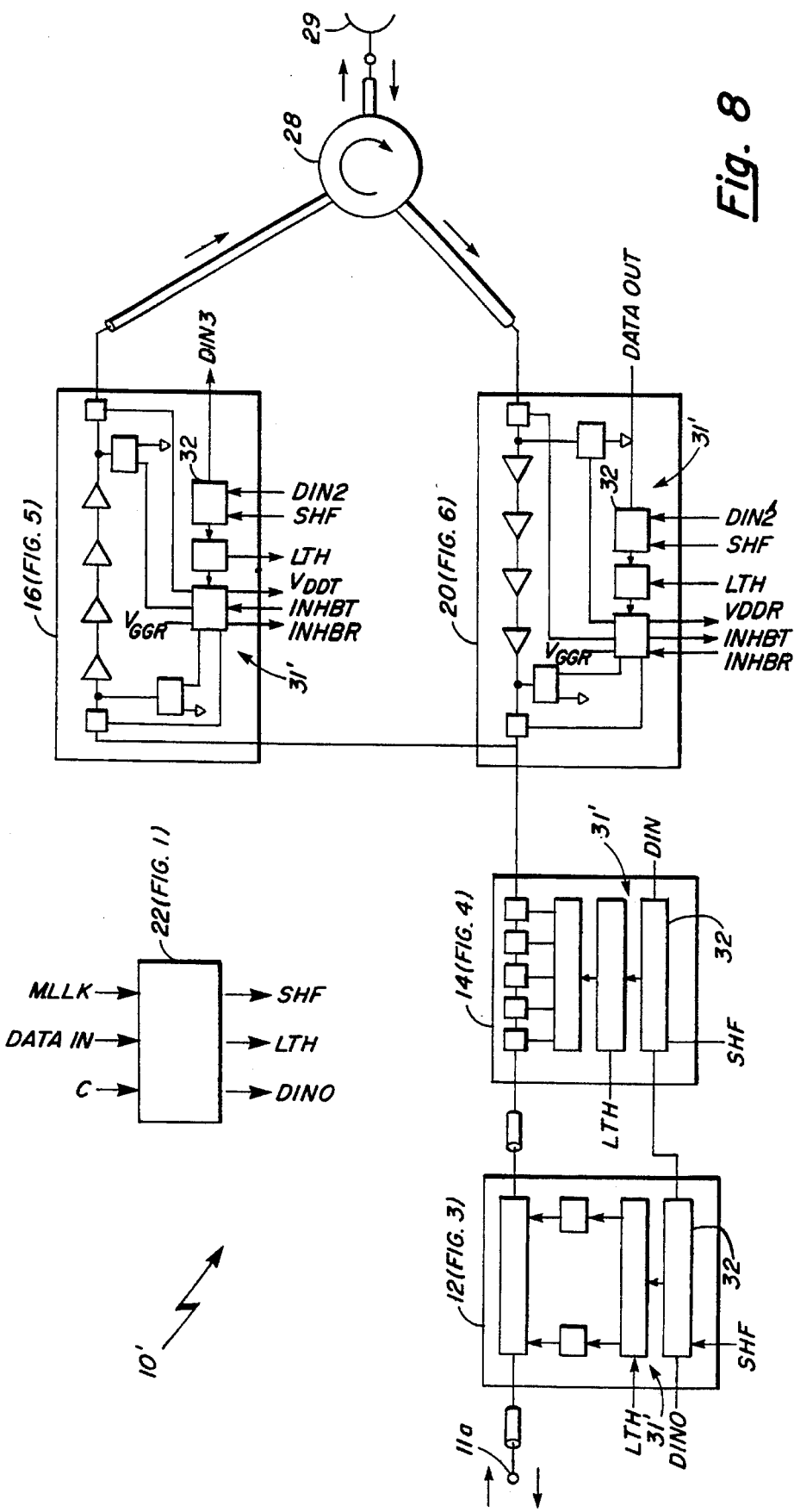
FIG. 8 is a schematic block diagram of a transmit/receive module showing an interconnection of digital signal control in accordance with a preferred aspect of the present invention.
Figure 13:
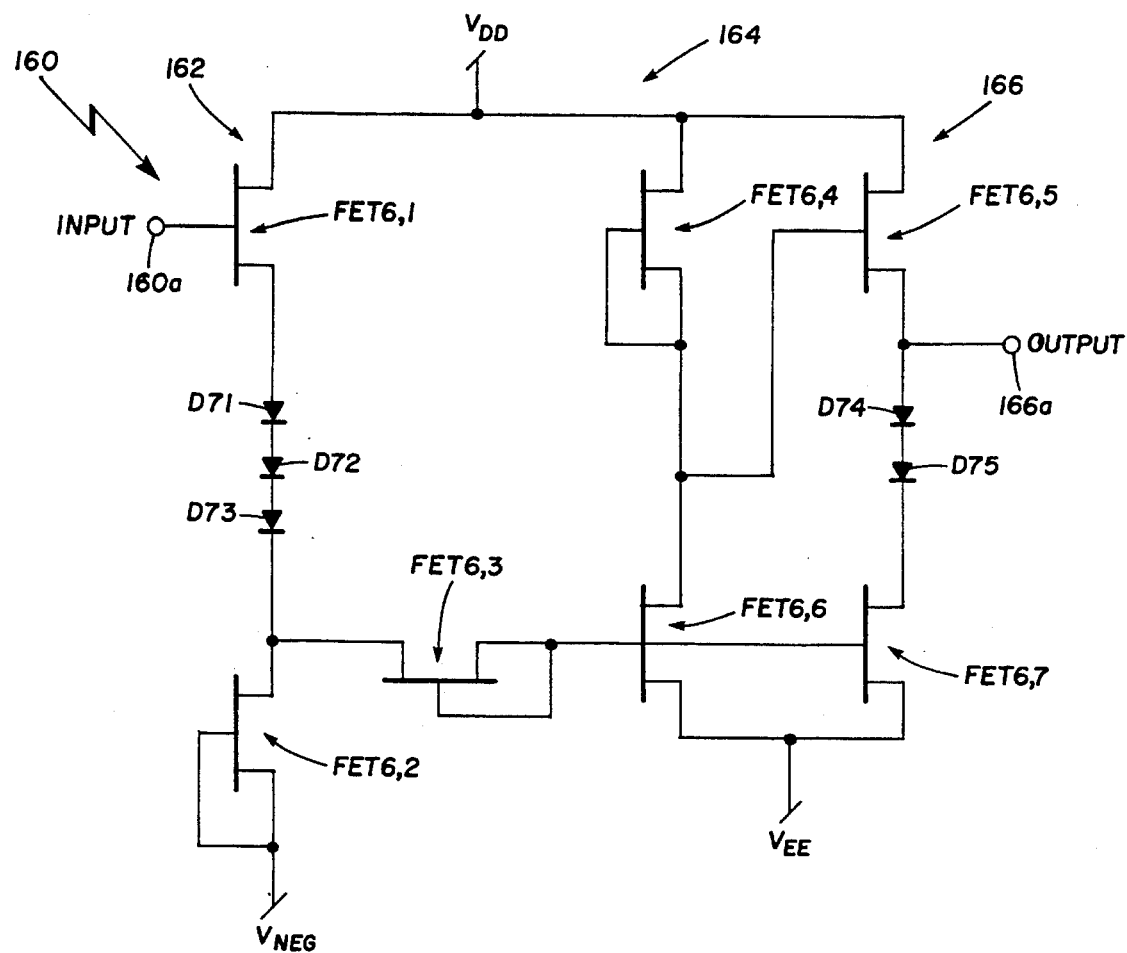
FIG. 13 is a schematic diagram of an output driver suitable for providing output voltage and current capabilities for driving analog monolithic microwave integrated circuits.

Referring now to FIG. 13, an output driver 160, which is connected between the internal digital logic devices, such as the NAND gate shown in FIG. 8 and a MMIC gate FET (not shown) or other MMIC control points is shown to include an input branch 162 comprised of a source follower FET 6,1 connected via 3 diodes $D_{71}$–$D_{73}$ to a current sink transistor FET 6,2. The drain electrode of transistor FET 6,2 is coupled via a series connected transistor FET 6,3, to gate electrodes of transistors FET 6,6 and FET 6,7, here the "pull down" transistors for the driver portion of the output interface 160. The drain electrode of transistor FET 6,6 is connected to a source electrode of a transistor FET 6,4 and to the gate electrode of a transistor FET 6,5. The source electrode of transistor FET 6,5 is connected via 2 diode drops $D_{74}$–$D_{75}$ to the drain electrode of transistor FET 6,7. When the gate electrode of transistors FET 6,6 and FET 6,7 are held high, the voltage on the gate of transistor FET 6,5 is pulled down close to the supply voltage "$V_{EE}$" and thus FET 6,7 "pulls down" the output 166a through two diode voltage drops towards the supply $V_{EE}$. Transistor FET 6,5 is turned off since its gate is at least 2 diode drops below its source. When the gates of transistors FET 6,6 and FET 6,7 are held low and thus these FETs are turned off, transistor FET 6,4 pulls the voltage on the gate of FET 6,5 to supply voltage VDD and thus transistor FET 6,7 can source a current in excess of $I_{DSS}$ to raise the output of the driver to the voltage of supply $V_{DD}$. Under these conditions, the quiescent current in the output branch is nearly zero thus reducing power dissipation in the output branch. Each of the transistors in the input buffer branch have twice the gate width els FET 6,5, a 4 micron wide FET. FET 6,6, FET 6,7 and FET 6, 5, diodes $D_{74}$, are all 50 microns wide. The average power dissipation of this circuit is about 3 milliwatts. Yet it is capable of switching MMIC FETs having gate widths of about 1 millimeter between zero and −6 volts in about 5 nanoseconds.

Figure 14:
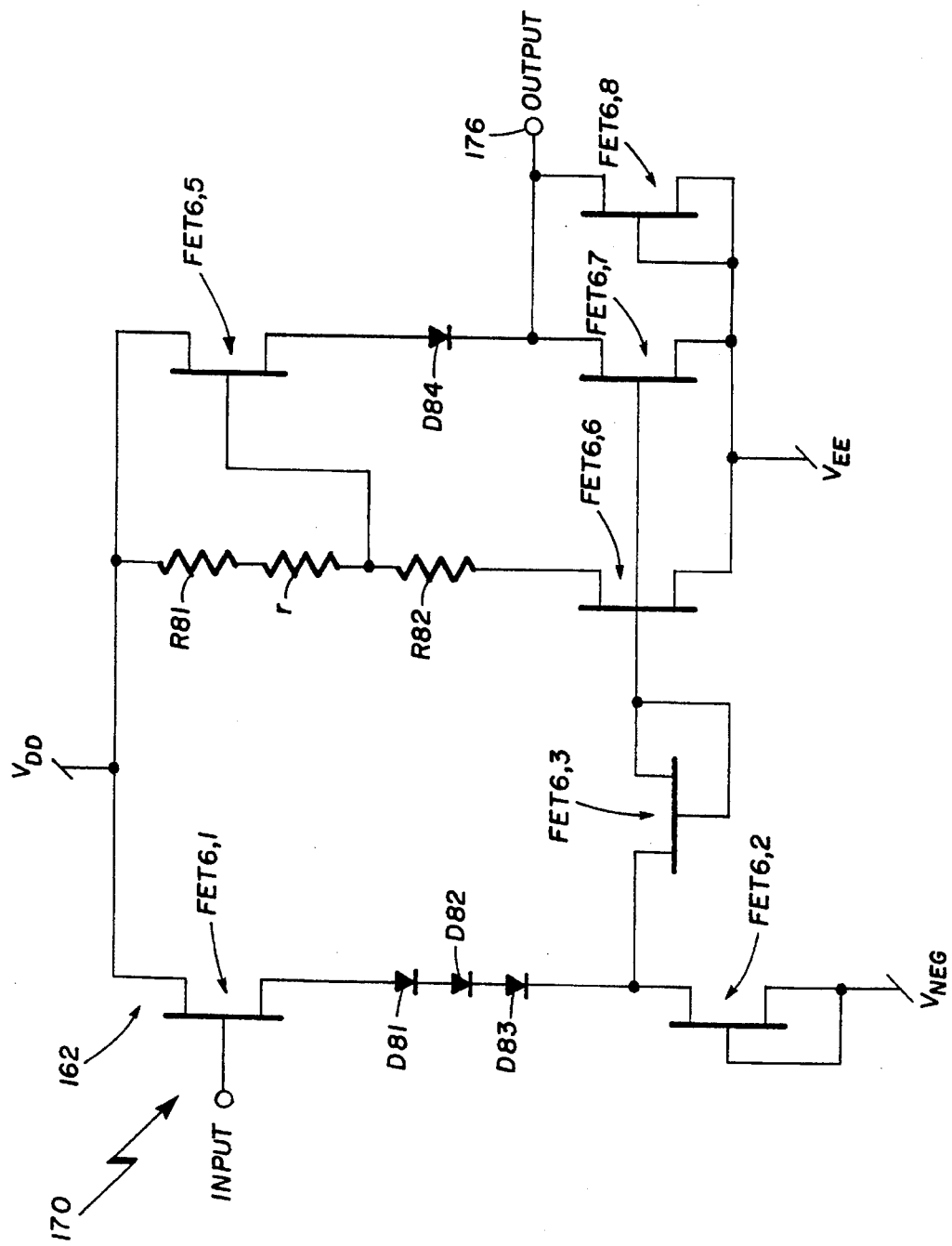
FIG. 14 is a schematic diagram of an adjustable amplifier driver for providing output voltage and current capabilities suitable for driving analog monolithic microwave integrated circuits.

Referring now to FIG. 14, a output voltage driver circuit 170 which provides a programmable or selectable output voltage is shown. Often different MMIC devices such as power amps, low-noise amps, switches and the like must be biased at different gate bias levels (e.g. at pinch off for switching circuits at 40% $I_{DSS}$ typical for power amps or 15% $I_{DSS}$ for low-noise amps). Adjustable amplifier driver 170 is shown to include an input circuit 162, as generally described above in conjunction with FIG. 13. Here, transistor FET 6,3 is also connected to pull down transistors FET 6,6, FET 6,7, as generally described above. Transistor FET 6,5 is connected here via one diode voltage drop $D_{84}$ to the drain electrode of transistor FET 6,7. A second transistor FET 6,8 is connected in shunt across transistor FET 6,7 with a gate electrode connected to a reference potential $V_{EE}$. The drain electrode of pull down transistor FET 6,6 is here connected to the gate electrode of transistor FET 6,5, as described above, and is also connected to a reference voltage, here provided by resistors $R_{81}$, $R_{82}$ and r. By adjusting r, the output high voltage supplied by the drive circuit can be adjusted to satisfy various bias conditions for MMIC amplifiers or switches as required. The input portion of this circuit is identical to that of the driver output circuit 160 as described in conjunction with FIG. 13. The quasi-push-pull section 164 (FIG. 13) however, has been modified by the addition of the resistor network $R_{81}$, $R_{82}$, r and the output of the circuit 170 is taken from the drain of pull down transistor FET 6,7 rather than from the source of the output source follower FET 6,1 (as in FIG. 13). The driver operates as follows: When the gate electrode of transistor FET 6,1 is held at a logic high the voltage drain output is pulled below the pinch off voltage of the MMIC FET being driven. FET 6,6 and 6,7 are turned on and the voltage on the gate electrode of transistor FET 6,5 is pulled close to $V_{EE}$ supply voltage level. Transistor FET 6,7 pulls the voltage at the output down to the $V_{EE}$ supply. Transistor FET 6,5 is reversed bias by 1 diode drop so that the current at the source of transistor FET 6,5 is less than 15% of $I_{DSS}$ thus keeping power dissipation to a minimum in the output branch. For input low to the gate of FET 6,1 the output voltage assumes a value that can be traced back to the output of the resistor divider network $R_{81}$, $R_{82}$, r. FET 6,6 and 6,7 are turned off and the gate of transistor FET 6,5 is held at a voltage determined by the resistor divider network $R_{81}$, $R_{82}$, r.

Figure 14A:
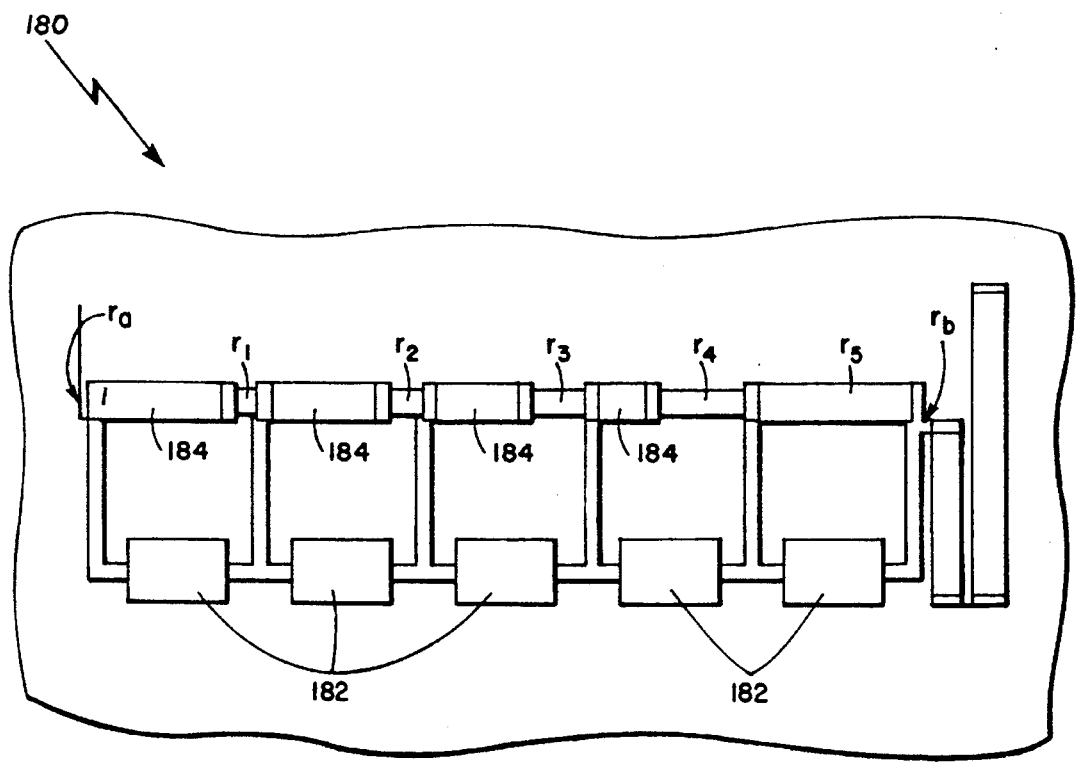
FIG. 14A is a plan view of a portion of a circuit used to provide a discretely adjustable voltage divider useful in the adjustable amplifier driver of FIG. 14.

The resistor r is adjustable and is here actually a composite network 180 of individual resistors $r_1$–$r_5$ between points $r_a$, $r_b$, as shown in FIG. 14A, connected in series via conductors 184, each of whose values are binary weighted ratios, that is $2^0$, $2^1$, $2^2$, $2^3$, and so forth. In manufacture of such a circuit the conductors 184 on a substrate 181 supporting the resistor network 180 and air bridges 182 are provided to short each of these resistors $r_1$–$r_5$ together. The resistors are connected such that the air bridge conductors 182 can be selectively cut with a probe to provide an adjusted value of the resistor r. The FET 6,8 is about 10% of the width of transistor FET 6,5, and hence transistor FET 6,5 is biased so it sources 10% of its $I_{DSS}$. Thus for a 0.8 volt threshold FET, a gate bias voltage of about 0.5 volts is required and thus the output voltage at output 176 is almost equal to the voltage at the gate of FET 6,5. A scheme using a resistive network similar to the one described above are also used to provide adjustable bias for the gates of the amplifiers on the MMIC circuits.

In order to switch the amplifiers on and off in a reasonably short time, the resistance values need to be on the order of 1K ohms, however, with the voltages involved in the resistor network 180, the network 180 alone would dissipate about 50 milliwatts of power. In the circuit described above, the resistor network 180 is buffered by the source follower FET 6,5 so that the impedance of the resistor network can be increased to about 20 kohms yet the circuit can still provide reasonable switching speeds and drive capability while reducing output power dissipation. The driver 170 as shown in FIG. 14 thus dissipates approximately 8 milliwatts of power in output low state and 2 milliwatts of power in the output high state for an average power dissipation of about 5 milliwatts.

Figure 15:
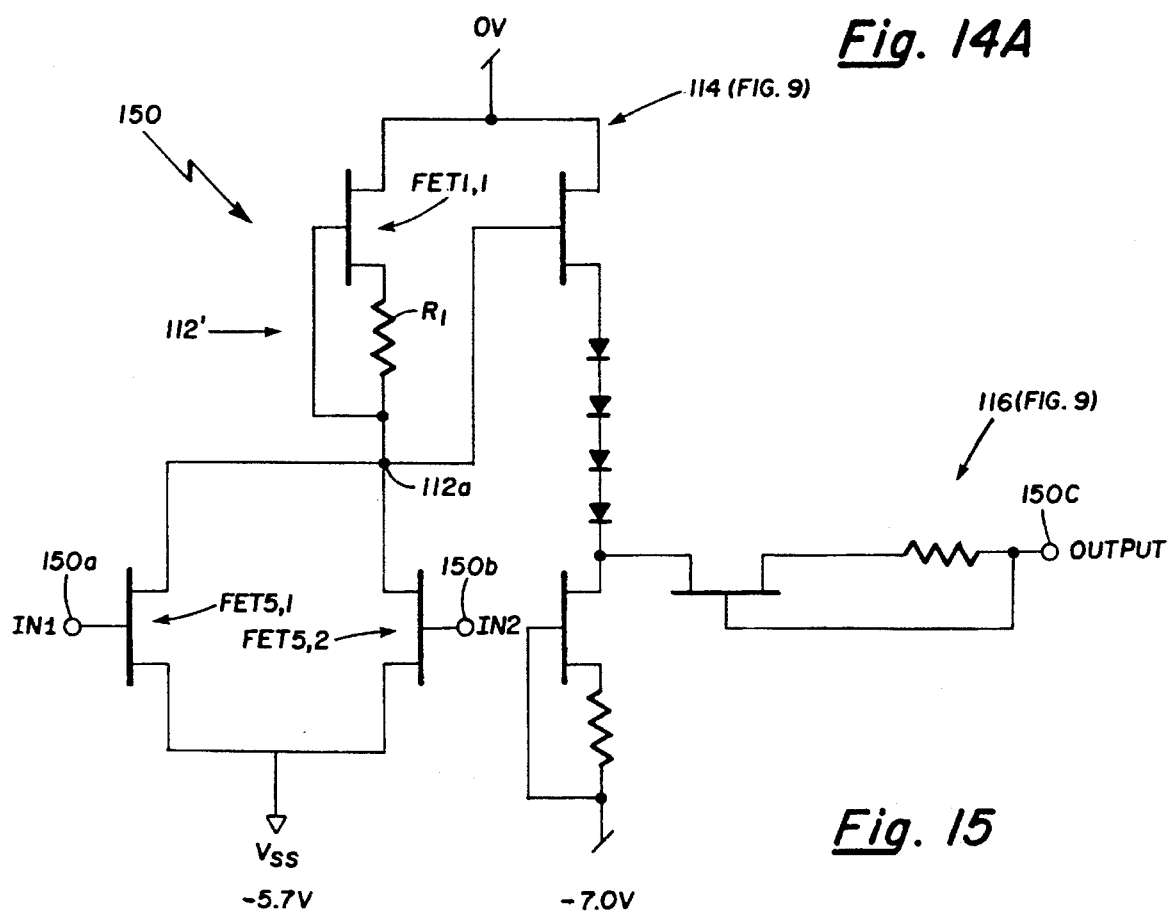
FIG. 15 is a schematic diagram of a "NOR" gate of the logic family described in conjunction with FIG. 9.

Referring now to FIG. 15, a digital MMIC "NOR" gate 150 is shown to include a modified logic branch 112' including load transistor FET 1,1 coupled to current limit resistor $R_1$ as generally described in conjunction with FIG. 9 and a pair of shunt coupled transistors FET 5,1, FET 5,2 having drain electrodes connected to a common node 112a, source electrode connected to a common potential $V_{SS}$, and gate electrodes connected to input terminals 150a, 150b. The output terminal 150c is connected through an output network 116 as also generally described in conjunction with FIG. 9.

The implementation of a digital MMIC NAND gate as described in conjunction with FIG. 9 generally is limited to about 2 input transistors in series because the channel resistance ($r_{on}$) (not referenced) is relatively high and more than about 2 transistors in series will upset logic voltage levels, whereas the implementation of a "NOR" gate is typically limited to about 4–5 inputs depending on switching speed requirements.

Fabrication of digital MMIC transistors, level shifting diodes, and analog MMIC transistors on a common substrate to provide such MMICs having digital interfaces, as shown in FIG. 7, will now be described in conjunction with FIGS. 16–31.

Figure 16:
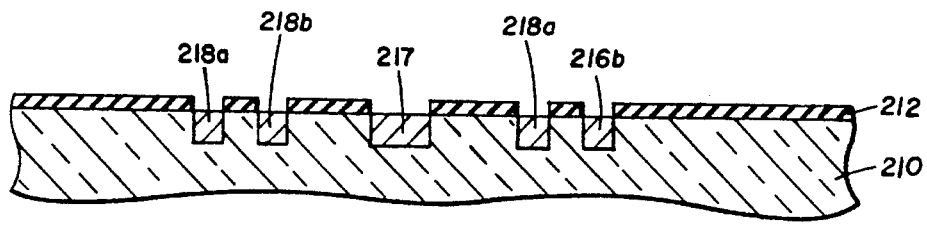
FIGS. 16–31 are a series of cross-sectional views showing steps in a process of fabricating a digital metal semiconductor field effect transistor, a level shifting diode, an analog metal semiconductor field effect transistor, a metal insulator semiconductor capacitor (MIS capacitor), a tantalum nitride resistor, transmission lines, and digital interconnects on a common substrate.

Referring first to FIG. 16, a semiconductor substrate 210, here comprised of gallium arsenide or other suitable group III–V material is prepared prior to processing. The substrate 210 is here cleaned in an ammonia water solution and subjected to a sulfuric acid etch to remove material containing residual substrate damage resulting from the substrate fabrication. After the substrate is prepared, the substrate is implanted to provide N+ contact regions defining ohmic contact regions 218a, 218b for a digital FET (not numbered), N+ contact regions 216a, 216b for analog FET (not numbered), and an N+ contact region 217 for a level shifting diode (not numbered). Such regions are provided by disposing a mask layer 212 over the substrate 210 with here said mask layer 212 comprised of a positive photoresist. The mask layer 212 is conventionally patterned to expose the substrate to provide implant regions (not numbered) and alignment marks. Substrate 210 is etched to transfer the alignment marks. The exposed regions are implanted ions with $^{29}Si^+$, at a dose rate of $1\times10^{13}$ atoms per centimeter squared at an energy of 200 keV (kilo electron volts). After the implant step the regions 216a, 216b, 217, and 218a, 218b shown are provided and the photoresist mask 212 is stripped away by an oxygen plasma etch.

Figure 17:
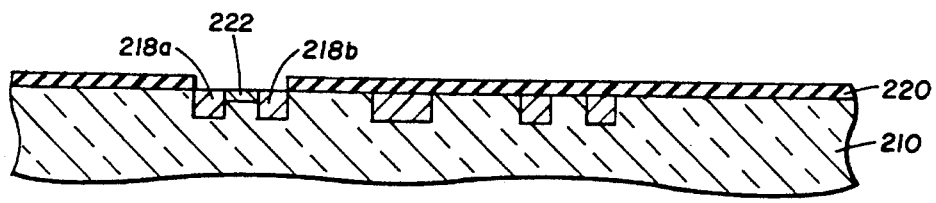

Referring now to FIG. 17, a channel region 222 is provided for each of the digital MESFETs (not numbered) by providing a second mask layer, here 220 over the substrate and patterning said mask layer to expose the N+ implants 218a, 218b corresponding to each of the digital MESFETs. A shallow implant as further specified by Table I is used to provide channel region 222 for the digital FET between contacts 218a, 218b. Here the implanted ion species is also $29Si^+$.

Figure 18:
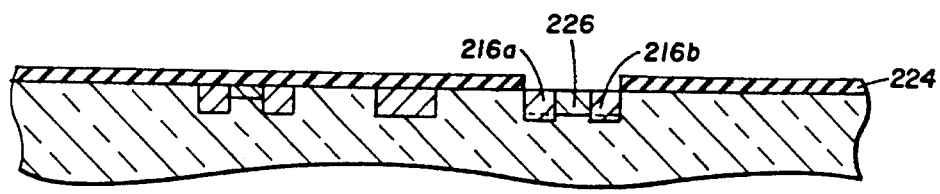

Referring now to FIG. 18, the substrate 210 having been stripped of the photoresist mask 220 described in conjunction with FIG. 16 is provided with a second photoresist mask 224 as shown. Here photoresist mask 224 is patterned to expose the $N^+$ regions 216a, 216b corresponding to each of the analog MESFETs. A deeper implant than that used for the digital FETs is used to provide channel region 226, as also shown. An example of an implant schedule for the digital MMIC and analog MMIC FETs is given below in Table I. In general, the digital channel is implanted to a depth of 0.2 microns, whereas the analog channels are implanted to a depth of 0.4 microns.

TABLE I

| CHANNEL TYPE | DOSE ($10^{10}$ ions/cm$^2$) | ENERGY (keV) | NOMINAL THRESHOLD (V) |
| --- | --- | --- | --- |
| MMIC | 0.60 | 70 | −4.0 |
|  | 0.84 | 130 |  |
|  | 3.00 | 260 |  |
| DIGITAL | 1.40 | 50 | −1.0 |
|  | 3.70 | 150 |  |

Thereafter, an anneal cap layer (not shown), here of silicon nitride about 500 angstroms thick is deposited over substrate 210. The substrate 210 is heated to a temperature of here 800° C. for 15 minutes in a hydrogen atmosphere to anneal-out crystal lattice implantation damage caused by the implantation of the $^{29}Si^+$ donors and to activate the $^{29}Si^+$ donors. The anneal cap is removed in diluted hydrogen fluoride and a 100 angstrom thick layer (not shown) of the substrate surface is etched off to remove interfacial damage caused by the cap.

Figure 19:
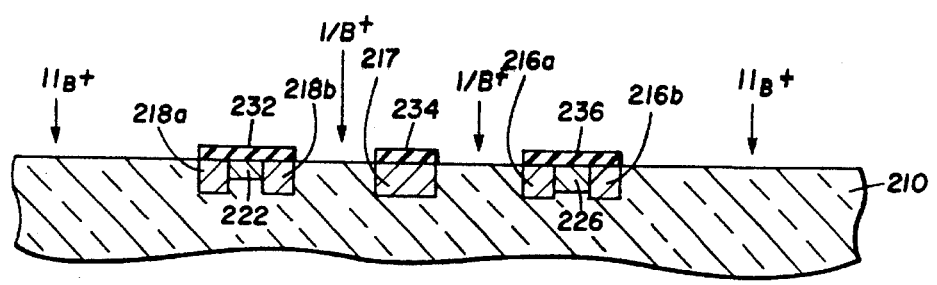

Referring now to FIG. 19, the active regions formed in substrate 210 are isolated by implanting a species which renders exposed portions of the material of the substrate 210 semi-insulating. Here the species, which is implanted is 11B+. Here, to isolate the active regions, a layer (not shown) of photoresist is deposited over substrate 210 and is patterned to provide regions 232, 234, 236 covering respectively underlying contact and channel regions 218a, 218b and 222, 217, and 216a, 216b and 226, as shown. The substrate 210 is then exposed to a ion flux of $^{11B+}$. Unmasked or exposed portions of said substrate 210 are implanted with the isolating ion to provide implantation damage to the crystal lattice of GaAs substrate 210 to thus render such exposed regions semi-insulating. A typical implantation schedule used to provide suitable lattice damage to render such exposed areas semi-insulating is a dose rate of $^{11}B^+$ ions at $5 \times 10^{11}$ ions/cm$^2$ at an energy of 120 keV. After implantation of the ions the patterned resist areas 232, 234, and 236 are stripped off in an oxygen plasma etch.

Figure 20:
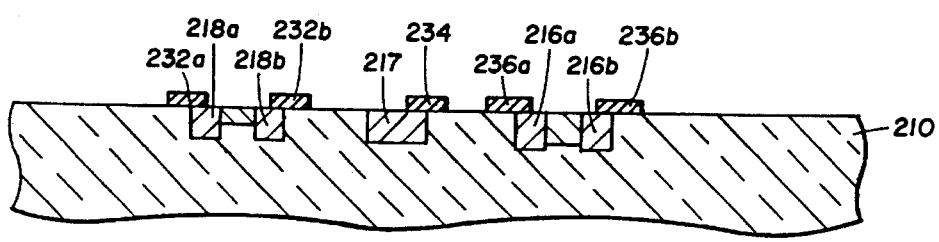

Referring now to FIG. 20, low resistivity ohmic contacts are provided over contact regions 216a, 216b, a portion of contact region 217, and regions 218a, 218b, as shown. Here a layer of photoresist (not shown) 2 microns thick is spun over the surface of substrate 210 and is exposed on a contact aligner through a mask having an image opposite in polarity to the desired pattern to be exposed on the surface. The masking layer (not shown) is treated with an ammonia vapor and flood exposed with ultraviolet light to reverse the image. The layer is developed in a conventional developer. This resist is patterned by a so-called image reversal technique. After the resist is patterned so that the contact layers are exposed, a metal layer (not shown) is deposited over the photoresist layer (not shown) as well as through the patterned areas and on exposed portions of the substrate to provide contacts 236a, 236b over regions 218a, 218b, contact 234 over region 217, and contacts 232a, 232b over regions 216a, 216b, respectively as shown. The metal layer deposited is a composite layer of here 50 angstroms of nickel, 900 angstroms of gold germanium, 300 angstroms of nickel, and 4000 angstroms of gold. Here each of such layers are evaporated. The portions of said composite metal deposited on the photo resist layer (not shown) are "lifted off" as the photoresist layer is removed leaving contacts 232a, 232b; 234; and 236a, 236b for source and drain electrodes of the digital transistors, a cathode contact for the level shifting diode, and source and drain electrodes for analog transistors, respectively. After "lift off" the surface is exposed to a high temperature, here 430° C. for 10 seconds to alloy the metal contacts 236a, 236b, 234, 232a, and 232b with the underlying gallium arsenide surface. This provides low resistivity ohmic type contacts.

Figure 21:
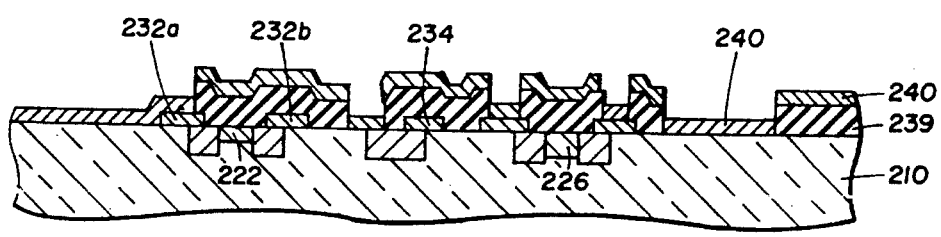
Figure 22:
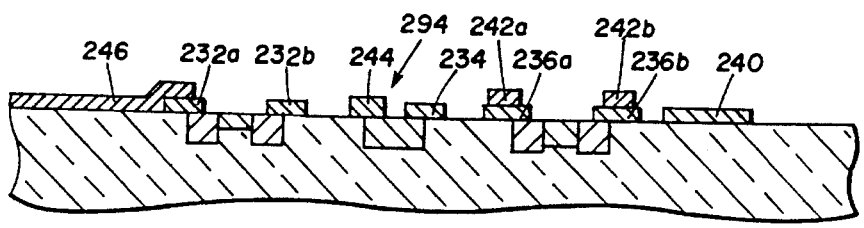

Referring now to FIGS. 21 and 22, bottom plates of metal insulator metal (MIM) capacitors, anode contacts for level shifting diodes, first level conductors for interconnecting digital circuits and thicken source and drain contacts for analog MESFETs are provided.

Referring first to FIG. 21, a photoresist layer 239 is disposed over substrate 210 and is patterned to provide regions which cover channel regions 222, 226, cathode contact 234, and here ohmic contacts 232a, 232b of a digital MESFET (not numbered). A composite layer 240 including a layer of a Schottky barrier forming metal, here 1000 angstroms of titanium, 1000 angstroms of platinum, and 5000 angstroms of gold are sequentially evaporated over the surface of substrate 210. Portions of said layer, which deposit on the photoresist layer 239 are removed by a subsequent lift off of the photoresist layer as described in conjunction with FIG. 20, whereas portions of the metal are deposited through the patterned resist onto the substrate 210 to provide the bottom contact 240 of a MIM capacitor and anode contact 244 of a level shifting diode 294, as shown. Also, the bottom or first level conductors for digital interconnection 246 are provided during the same processing step using the Schottky barrier forming metals. Here one of the first level conductors 246 is connected to ohmic contact 232a, one of the source and drain electrodes of a digital MESFET (not numbered). Thus, the use of a Schottky barrier metal step is used to simultaneously thicken the contacts 236a, 236b of analog MESFETs (not numbered), provide the bottom contact 240 for the MIM capacitor (not numbered), and the anode contact 244 for the level shifting diode 294. The drain and source electrodes 232a, 232b of the analog MESFETs are generally thickened in order to increase the current carrying capability of the contact by reducing electromigration which is caused by excessive current passing through the contacts.

Figure 23:
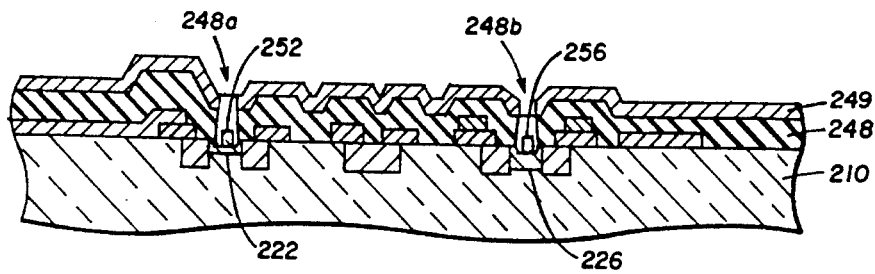
Figure 24:
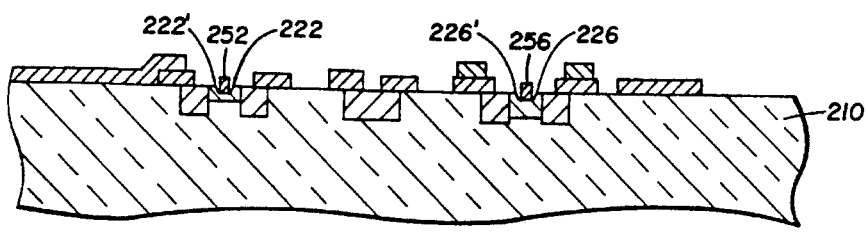

Referring now to FIGS. 23 and 24, a layer of photoresist 248 is deposited over substrate 210 and is patterned using the same image reversal photo technique described above in conjunction with FIG. 19 to define patterned regions (not numbered) over the channel regions 222, 226 through which will be provided gate electrodes in Schottky barrier contact to said channels 222, 226. Prior to providing the Schottky barrier contacts, however, the channel regions are simultaneously etched to a predetermined depth to control the pinch off voltage or threshold voltage of each channel. This is accomplished by patterning the photoresist layer 248 to provide a pair of apertures 248a, 248b exposing selective underlying portions of channel regions 222, 226, as shown. Here the patterning technique to pattern layer 248 is the image reversal technique, as described in conjunction with FIG. 20. After the apertures are provided in the photoresist layer 248, an etchant is brought into contact with the exposed gallium arsenide in channel regions 222, 226 and simultaneously the channel regions 222, 226 are etched or recessed. The channels are recessed while monitoring the saturation current of a representative field effect transistor disposed on substrate 210 until a predetermined value of such current is achieved. For example, for the digital implant, this value is 20 milliamps per millimeter for a 100 micrometer FET. Alternatively, the step of providing the recess may be accomplished by etching the channels for a fixed period of time. After the channels have been etched and cleaned, using conventional techniques, the Schottky forming metal is disposed over the photoresist layer 248 and within the apertures 248a, 248b to provide gate electrodes 252, 256, as shown in FIG. 24. Here 1000 angstrom thick layer of titanium followed by 1000 angstrom thick layer of platinum, and a 3000 angstrom thick layer of gold generally denoted as layer 249 are evaporated over the layer 248. After layer 248 is lifted off, Schottky barrier gates 252, 256 are provided as shown in FIG. 24.

Figure 25:
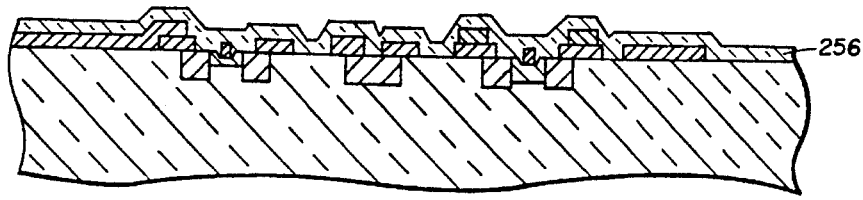

Referring now to FIG. 25, a passivation layer 256 is disposed over the surface of the gallium arsenide substrate 210 to a thickness of here 2000 angstroms. The passivation layer 256 is here silicon nitride provided by plasma enhanced chemical vapor deposition technique. The silicon nitride ($S_{i3}N_4$) serves to conformally cover the surface of the wafer, to provide passivation, and also serves as the dielectric for MIM capacitors as well as the dielectric to dielectrically space the first and second level metal interconnects for the digital circuits.

Figure 26:
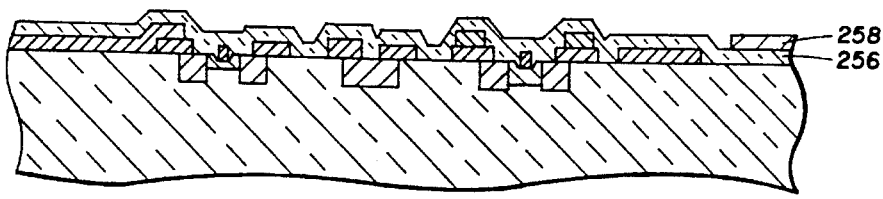

Referring now to FIG. 26, here a high resistivity layer (not shown) having a thickness of 4000 angstroms and comprised of tantalum nitride is sputtered deposited over the passivation layer 256 and is patterned to provide a region 258 used to form a tantalum nitride (TaN) resistor. The tantalum nitride layer (not shown) is patterned using a positive photo imaging technique as used for the implant masks followed by a reactive ion etching step to etch the exposed tantalum nitride material and provide the region 258, as shown in FIG. 26. Contacts for the resistor are provided on the TaN region 258, as will be described in conjunction with FIG. 30.

Figure 27:
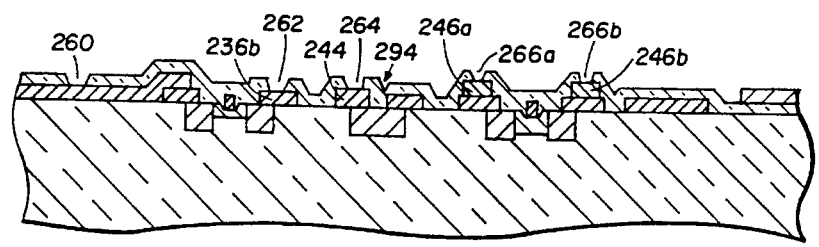

Referring now to FIG. 27, the passivation layer 256 and the tantalum nitride region 258 are covered with a layer of photoresist (not shown). The layer of photoresist is then patterned to provide apertures (not shown) which expose underlying portions of the passivation layer 256, here said apertures being disposed over source, drain, and gates of digital and analog MESFETs, anodes and cathodes of level shifting diodes, capacitor bottom plates, and first level digital interconnect conductors 246 for the digital circuits, as required to access such devices or conductors. These apertures are provided through the silicon nitride passivation layer by using a reactive ion etch, as was used to provide the tantalum nitride region 258 (FIG. 25). Thus, after removal of the masking layer as shown in FIG. 26, a portion of the underlying first level interconnect 246 is exposed via aperture 260, the source electrode 232 of the digital FET (not numbered) is exposed via aperture 262, the anode contact 244 of the level shifting diode 294 is exposed via aperture 264, and thickened source and drain contacts 246a, 246b of the analog MESFET are exposed via apertures 266a, 266b, respectively as shown.

Figure 28:
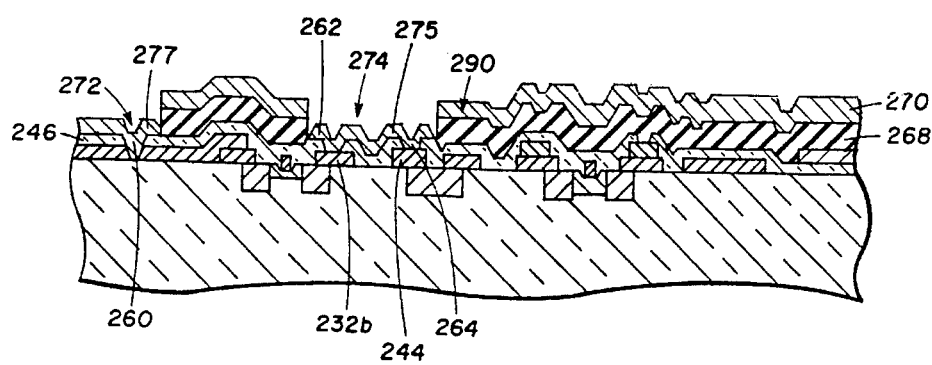
Figure 29:
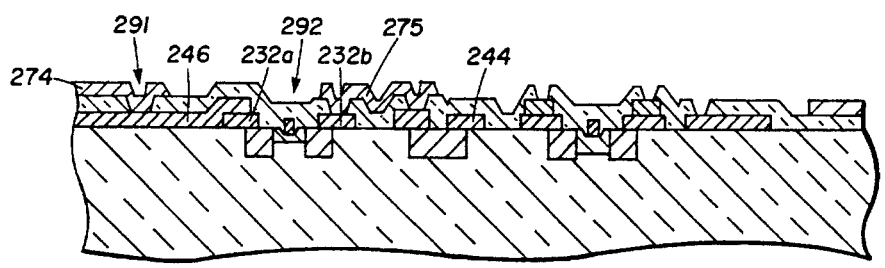

Referring now to FIGS. 28 and 29, a photoresist layer 268 is deposited over substrate 210. Photoresist layer 268 is patterned using any conventional technique to expose underlying portions of circuit features which are to be interconnected to provide a second level of metalization for the digital circuits. The photoresist layer 268 is here patterned to provide apertures 260, 262, 264 provided above. Layers of metals (generally denoted as 270), here comprised of 400 angstroms of titanium and 1 micron of gold are deposited through the patterned regions 272, 274, and in the apertures 260, 262, and 264, as shown. Layer 270 provides one second level digital interconnect 277 here connected to the bottom first level digital interconnect 246, by a conductive portion thereof disposed through aperture 260 and another second level interconnect 275 connected between the source electrode 232b of the digital FET 292 through aperture 262 and the anode 244 of level shifting diode 294 through aperture 264. After the metal is deposited, the photoresist layer 268 is stripped away and the portion of metal layer 270 over photoresist layer 268 is removed, leaving interconnects 275 and 277, as shown in FIG. 29.

Figure 30:
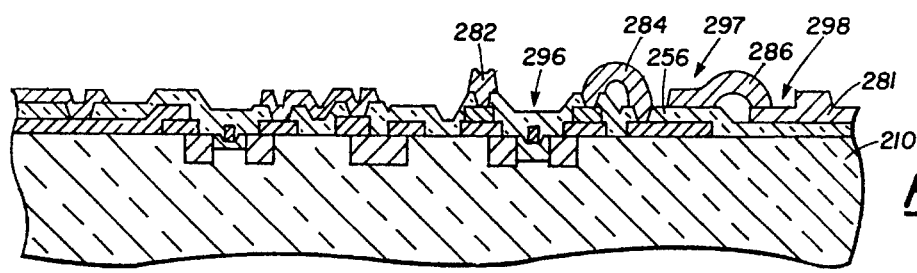

Referring now to FIG. 30, the source, drain, and gate electrodes of analog field effect transistors 296, the electrodes of MIM capacitors 299, and the layer of tantalum nitride of the resistor 298 are interconnected with a 3 micron thick gold metalization layer, which serves as the strip conductor for a low-loss microwave microstrip transmission line. The process used to provide the thick metal interconnects for the analog transistors is first provided by forming resist spacer layers (not shown) over regions where air bridges will be provided. After the spacers have been defined, a photoresist layer (not shown) is used to define patterns for the air bridge interconnects and transmission lines. Metal is deposited through said pattern layers and over the air bridge resist spacers to provide the air bridge structures 284, 286, and transmission lines 282, 287, as shown in FIG. 30. Techniques as described in U.S. Pat. No. 4,670,297 assigned to the assignee of the present invention may be used to provide the air bridges, for example.

Figure 31:
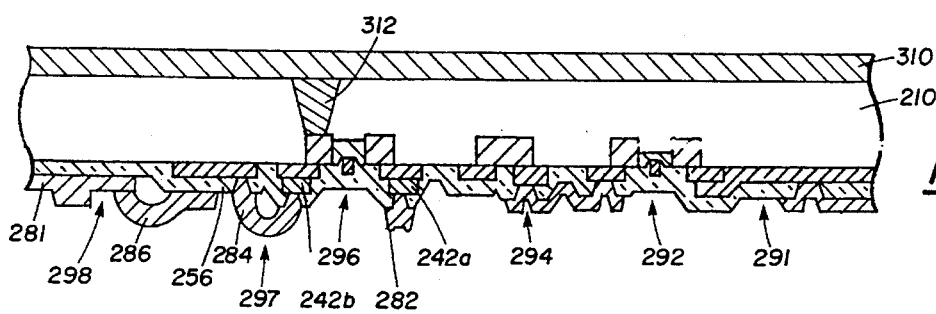

Referring now to FIG. 31, backside processing of substrate 210 is provided to form plated vias 312 to interconnect capacitors, and source electrodes of analog MESFETs to a ground plane conductor 310, as shown. Here conventional techniques are used, such as those described in U.S. Pat. No. 4,807,022 by Kazior, et al. and assigned to the assignee of the present invention or U.S. Pat. No. 4,794,093 by Tong et al. and assigned to the assignee of the present invention. In particular, the above mentioned patents provide techniques for forming via holes and plated tub structures and would be particularly desirable for those circuits which incorporate high-power dissipation elements, such as high-power transistors to provide low thermal impedance paths between the transistors and the ground plane conductor 310.

It should be appreciate that what has been described above is the general processing to form the circuit components commonly encountered in digital microwave monolithic integrated circuits (DMMICs) and analog micrcowave, microwave and millimeter wave monolithic integrated circuits (MMICs and MIMMICs). The above process did not describe any particular circuit, but can be used to provide all the circuits described in conjunction with FIG. 1–6, as well as other circuits using a monolithic microwave integrated circuit and a digital circuit on a common semiconductor substrate. In particular, the above approach is used to provide the circuit described in conjunction with FIG. 7.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A method of fabricating digital monolithic microwave integrated circuits and analog monolithic microwave integrated circuits on a common substrate comprising the steps of:

providing a substrate having regions for digital metal semiconductor field effect transistors, level shifting diodes, and analog metal semiconductor field effect transistors, said digital transistor region and analog transistor regions each including a channel region disposed on said substrate having source and drain contacts disposed in ohmic contact with said channel regions, and the diode region includes a channel region having an ohmic contact, and providing a patterned layer of metal over said substrate to form bottom layer interconnects for the digital transistors, thick source and drain contacts for the analog transistors, and a Schottky barrier contact for the level shifting diode.

2. The method of claim 1 wherein said patterned layer of metal is disposed to form a bottom contact of a capacitor.

3. A method of providing a digital monolithic microwave integrated circuit and an analog monolithic microwave integrated circuit on a common substrate includes the steps of:

providing a substrate having regions for digital metal semiconductor field effect transistors and analog semiconductor field effect transistors;

implanting ions to provide a first channel having a first depth in each one of said digital MESFET regions;

implanting ions to provide a second channel through each one of said analog MESFET regions, with said second channels being deeper relative to the depth of the first channels of the digital MESFETs; and simultaneously etching first and second recesses in the respective first and second channel regions of the digital and analog MESFETs respectively to provide recessed portions in the said channels to simultaneously define voltage threshold levels for digital transistors and the analog transistors.

4. The method of claim 1 further comprising the step of providing a gate electrode in Schottky barrier contact with said channel regions in each one of the analog and digital MESFETs.

* * * * *